(12) United States Patent
Petersen

(10) Patent No.: US 12,719,421 B2
(45) Date of Patent: Aug. 25, 2026

(54) SIGNAL AMPLIFIER

(71) Applicant: Renesas Design (UK) Limited, Bourne End (GB)

(72) Inventor: Holger Petersen, Pastetten (DE)

(73) Assignee: Renesas Design (UK) Limited, Bourne End (GB)

( * ) Notice: Subject to any disclaimer, the term of this patent is extended or adjusted under 35 U.S.C. 154(b) by 465 days.

(21) Appl. No.: 18/464,858

(22) Filed: Sep. 11, 2023

(65) Prior Publication Data

US 2025/0088151 A1 Mar. 13, 2025

(51) Int. Cl.
*H03F 3/217* (2006.01)
*H03F 1/02* (2006.01)

(52) U.S. Cl.
CPC ......... *H03F 3/2173* (2013.01); *H03F 1/0244* (2013.01); *H03F 2200/03* (2013.01); *H03F 2200/351* (2013.01)

(58) Field of Classification Search
CPC .. H03F 3/2173; H03F 1/0244; H03F 2200/03; H03F 2200/351; H03F 3/187; H02M 1/0048; H02M 1/0054; H02M 1/0095; H02M 3/07; H02M 3/072; H02M 3/158; H02M 7/4837
USPC ............................... 330/10, 251, 207 A, 297
See application file for complete search history.

(56) References Cited

U.S. PATENT DOCUMENTS 8,643,436 B2 2/2014 Ni et al.
9,444,419 B2 9/2016 Petersen
9,515,617 B2 12/2016 Høyerby
9,793,867 B2 10/2017 Frith et al.
10,284,155 B2 5/2019 Høyerby
2022/0140751 A1* 5/2022 Qi ........................... H02M 7/06 363/126

OTHER PUBLICATIONS

Chen et al, "Embedded Single-Inductor Bipolar-Output DC-DC Converter in Class-D Amplifier for Low Common Noise", IEEE Transactions on Power Electronics, vol. 31, No. 4, Apr. 2016, 12 pages.
"The ES8018 Sabre Smart Power Amplifier", 2019 ESS Technology, 3 pages.

(Continued)

*Primary Examiner* — Khiem D Nguyen
(74) *Attorney, Agent, or Firm* — SCULLY, SCOTT, MURPHY & PRESSER, P.C.

(57) ABSTRACT

A signal amplifier includes a driver and a network of switches forming a power converter coupled to a H-bridge circuit. The power converter has a flying capacitor and an inductor. The H-bridge circuit receives a converted voltage from the power converter and applies an output modulated voltage to a load, for instance a loudspeaker. The driver drives the network of switches in a neutral state, a first state and a second state. In the neutral state no voltage is applied to the load. In the first state, an input voltage supply and the inductor are serially coupled, and the flying capacitor is coupled in parallel with the serially coupled input voltage supply and inductor. In the second state, the flying capacitor is coupled in series with at least one of the input voltage supply and the inductor. The signal amplifier may be a multi-level class D or class H amplifier.

23 Claims, 26 Drawing Sheets

(56) References Cited

OTHER PUBLICATIONS

"Energy-Efficient Multi-Level Amplifier Solution", Audioxpress, Sep. 2018, p. 16-22.
"CS35L41 11 Volt Boosted Class D Audio Amplifier with DSP", Cirus Logic, Nov. 2018, 2 pages.
"MAX98307/MAX98308 3.3W Mono Class DG Multilevel Audio Amplifier", 2020 Maxim Integrated Products, Inc., Apr. 2020, 19 page.
Dahl et al, "Tracking Multilevel Power Supplies for Class-D Audio Amplifiers", Date of Publication: Mar. 12, 2020, Published in: IEEE Journal of Emerging and Selected Topics in Power Electronics ( vol. 9, Issue: 1, Feb. 2021). 13 pages. https://ieeexplore.ieee.org/document/9034085.

* cited by examiner

310 providing a network of switches between an input port, an output port and a ground port, the network of switches being arranged to form a power converter coupled to a H-bridge circuit, wherein the power converter comprises a flying capacitor and an inductor; the power converter being adapted to receive an input voltage from a voltage supply and to provide a converted voltage, and the H-bridge circuit being adapted to receive the converted voltage and to apply an output modulated voltage to a load;

320 providing a driver to operate the H-bridge circuit in a plurality of states for providing the output modulated voltage, the driver being adapted to drive the network of switches in a neutral state, a first state and a second state;

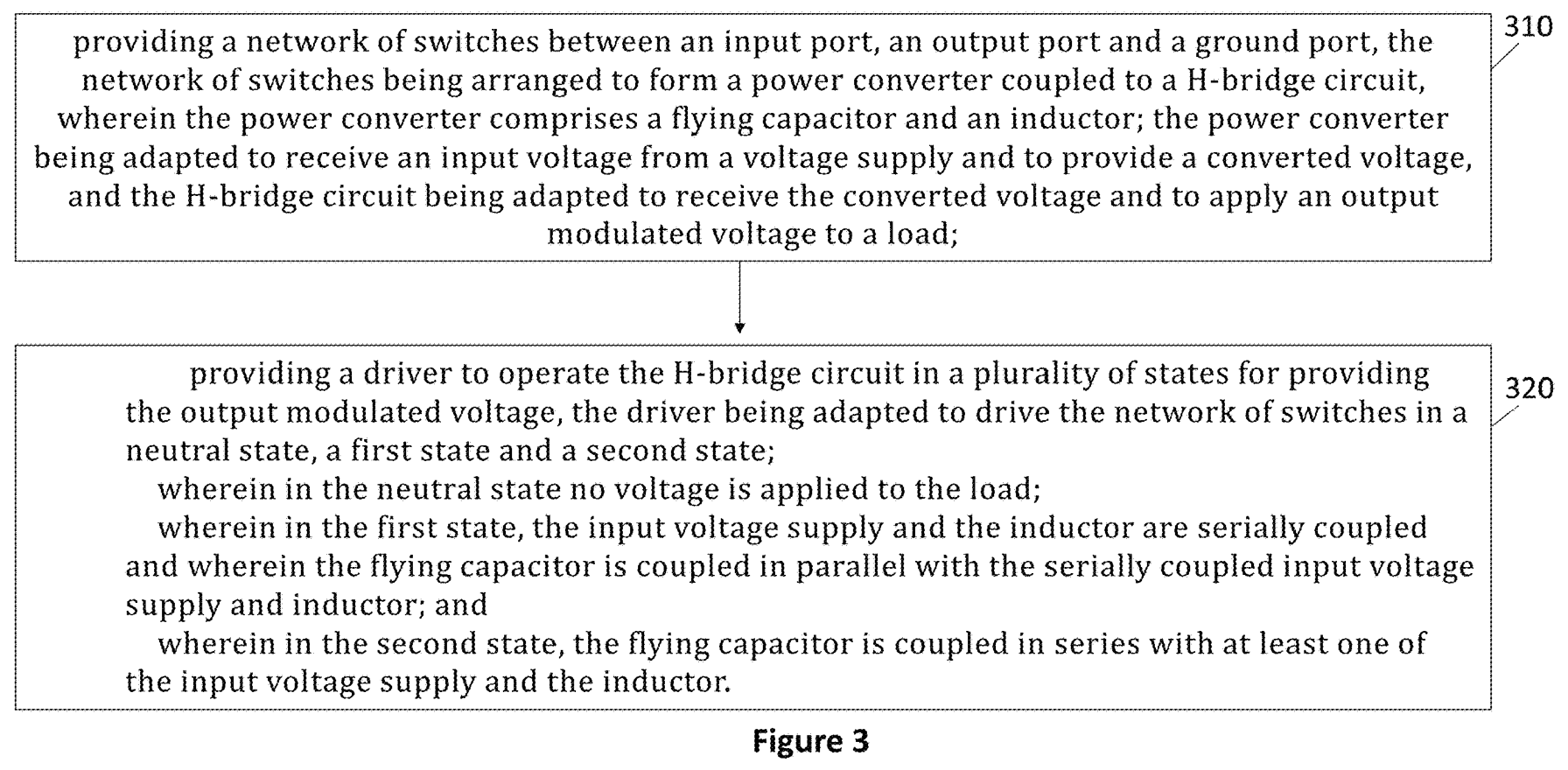

wherein in the neutral state no voltage is applied to the load;

wherein in the first state, the input voltage supply and the inductor are serially coupled and wherein the flying capacitor is coupled in parallel with the serially coupled input voltage supply and inductor; and wherein in the second state, the flying capacitor is coupled in series with at least one of the input voltage supply and the inductor.

Figure 3

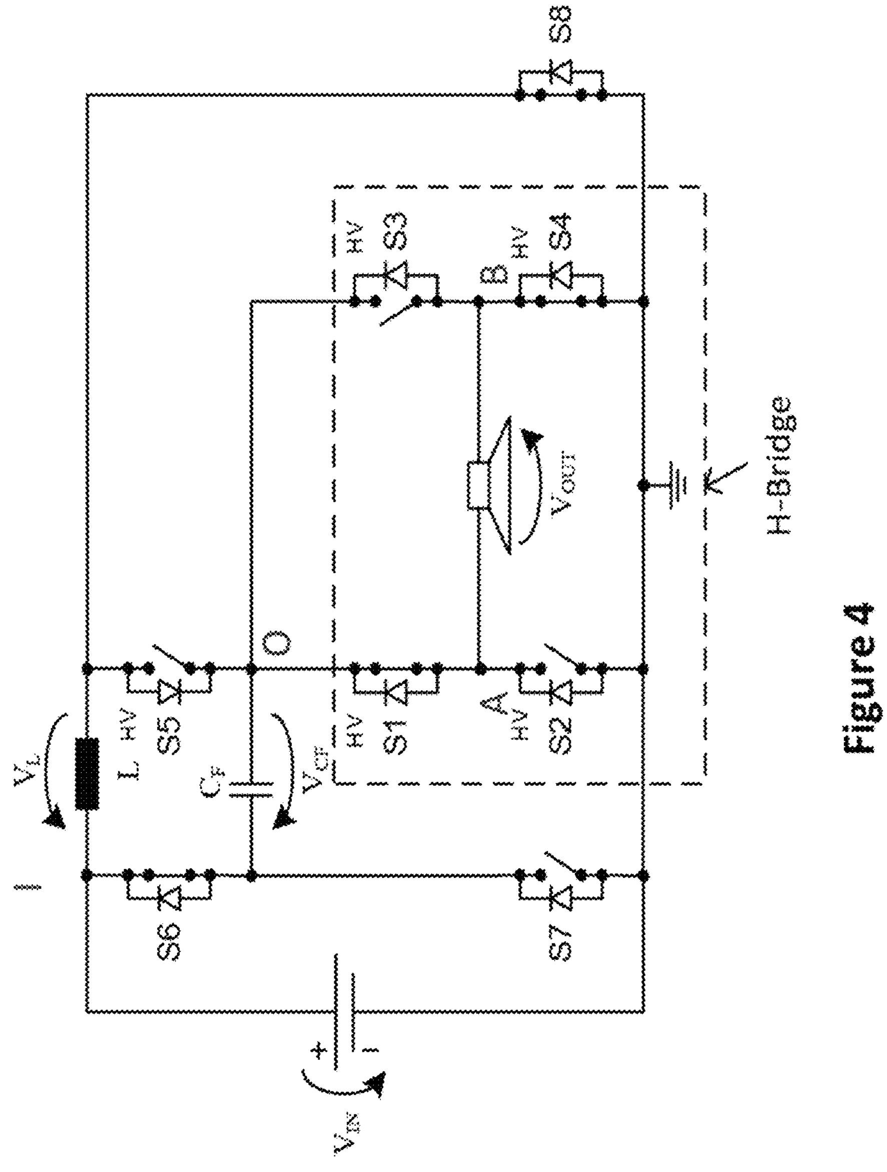
Figure 4
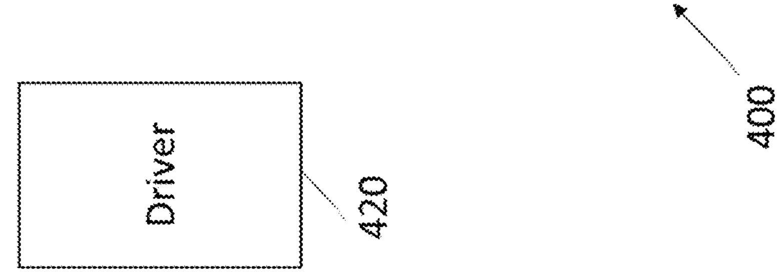

S8
S3
S4
S5
S11
S7
S9
S1
S2
S10
S6
L

1900

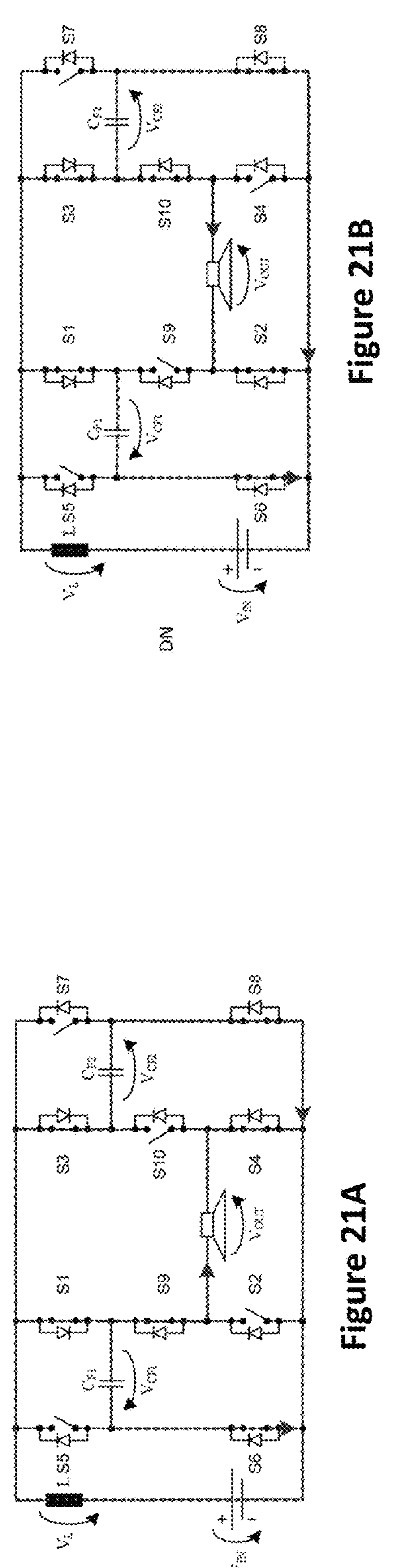
Figure 21B
Figure 21A
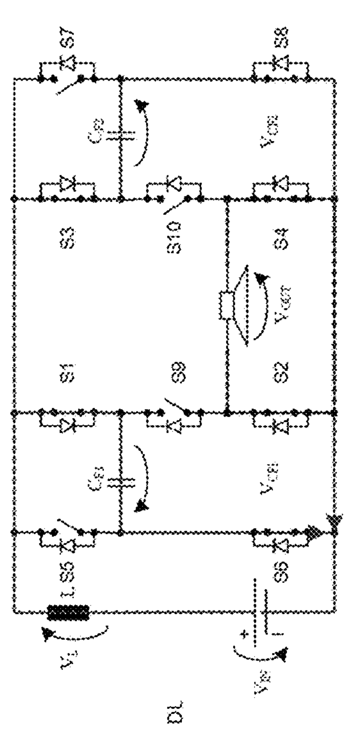
Figure 21C

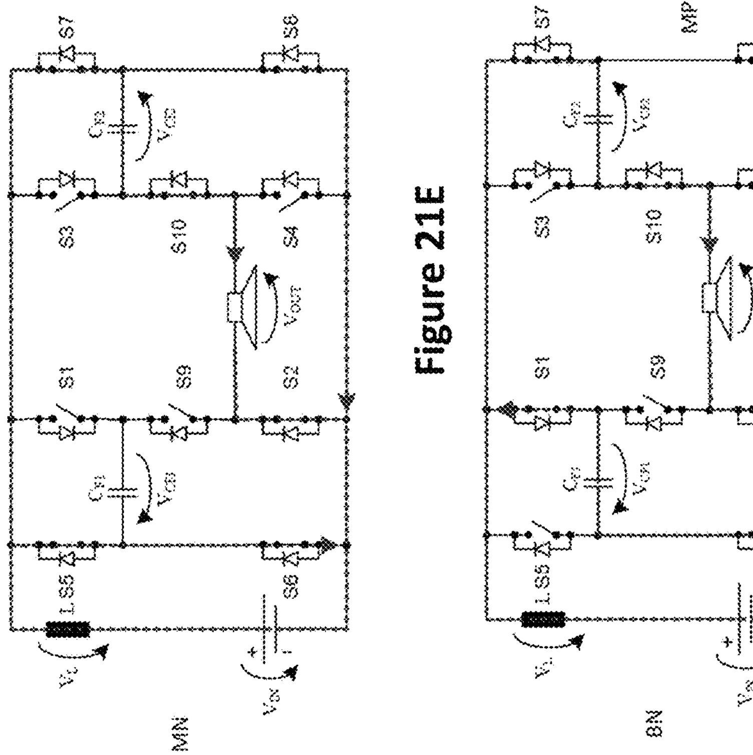
Figure 21E
Figure 21G
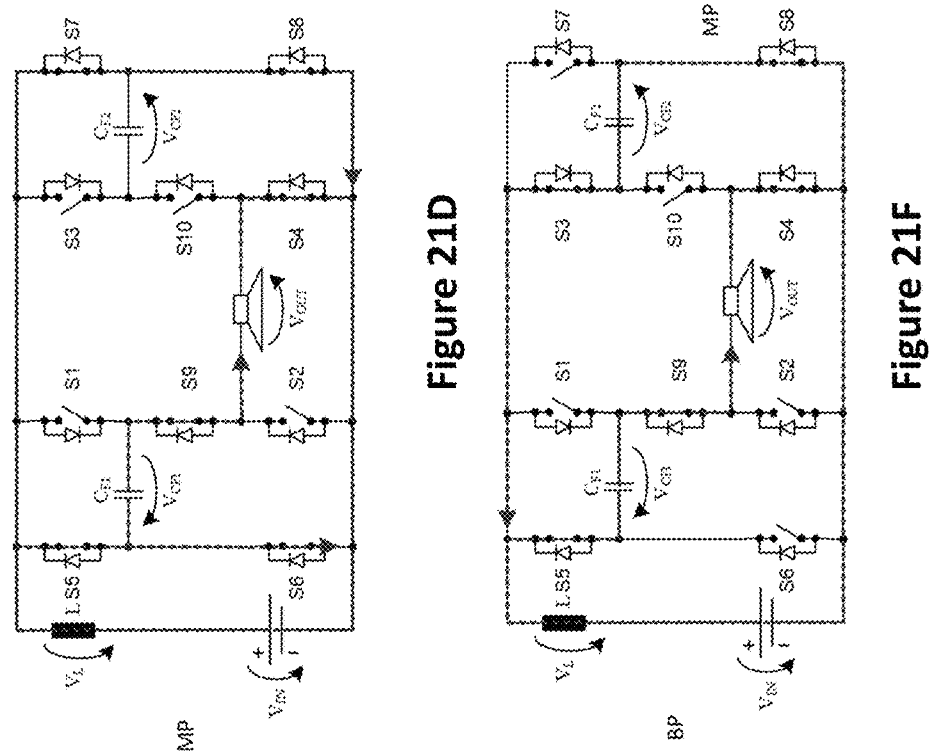
Figure 21D
Figure 21F

2400

SIGNAL AMPLIFIER

FIELD

The present disclosure relates to a signal amplifier, and in particular to a multi-level amplifier such as a multi-level class D or a multi-level class H amplifier.

BACKGROUND

User devices provided with a speaker, including laptops, tablets and mobile phones can have a limited acoustic power. The amplifier supply voltage determines the maximum output power that may be delivered into the load.

For instance, a mobile phone is typically powered by a lithium battery that may have a primary voltage of around 4.2 V when fully charged, falling to around 2.8 V as the battery is discharged. In this scenario the maximum power into the loudspeaker load (with a typical resistance value of for example 8 Ω) is limited to less than a few hundred milliwatts. Considering the 10-20 dB crest factor of typical voice and music signals, the average power of such an audio playback is further reduced.

To overcome this limitation, the supply voltage of the amplifier may be increased with a voltage step-up converter. As the loss of the power converter increases the drain of the battery, it is not desirable to run it all the time. Class H amplifiers are powered from supply voltage that is tracking the signal level. In U.S. Pat. No. 9,444,419 the step-up converter is dynamically activated only during high levels of the output signal, thus optimizing efficiency.

For mobile audio applications the amplifier efficiency may have a noticeable influence on battery life. Therefore, amplifier output stages with high efficiency may be preferred. If the power reaches multiple watts, the amplifier dissipation power may result in a significant temperature increase of the device, which should be avoided. Instead of increasing the voltage/current of the audio signal via linear amplification, a Class D output stage creates a pulse train with the amplitude of the supply voltage and a pulse density and/or pulse width proportional to the level of the input signal. The series of pulses is then converted back to an analog signal by passing it through a low pass filter consisting of inductors and capacitors. If the routing of a pulsed (high-power) signal is not creating critical EMI disturbances, the low pass filter may even be omitted and the parasitic inductance (inherent bandwidth) of the transducer functions as the required averaging. This pulse modulation is often combined with a complementary output, so that the loudspeaker load is driven from a differential output. This is well known as a "full-bridge" or "H-bridge" circuit.

The publication titled "Embedded Single-Inductor Bipolar-Output DC-DC Converter in Class-D Amplifier for Low Common Noise", IEEE, 2016 by Chen presents a derivative approach, producing a boosted positive rail in parallel to a boosted negative rail with a switching step-up converter using a single inductor. The power converter requires some time to adopt the voltage of its output capacitor. To avoid a "saturated" output signal from a H-bridge the control circuitry may delay the output of the audio signal and by that implement a so called "look-ahead-time". When the maximum amplifier output power is in the range of several watts, the output capacitor of the boost converter needs to be large, hence causing further extension of the audio signal delay. Furthermore, a large capacitor also requires time to discharge if the H-bridge output power is dropping from a sudden level drop of the audio signal level. This may keep the H-bridge supply voltage high longer than required, hence increasing the amplifier power loss and the emission of EMI noise.

It is an object of the disclosure to address one or more of the above-mentioned limitations.

SUMMARY

According to a first aspect of the disclosure, there is provided a signal amplifier comprising:

- a network of switches provided between an input port, an output port and a ground port, the network of switches being arranged to form a power converter coupled to a H-bridge circuit, wherein the power converter comprises a flying capacitor and an inductor; the power converter being adapted to receive an input voltage from a voltage supply and to provide a converted voltage, and the H-bridge circuit being adapted to receive the converted voltage and to apply an output modulated voltage to a load; and
- a driver adapted to operate the H-bridge circuit in a plurality of states for providing the output modulated voltage, the driver being adapted to drive the network of switches in a neutral state (DL), a first state (DP or DN) and a second state (MP or MN);
- wherein in the neutral state no voltage is applied to the load; wherein in the first state (DP or DN), the input voltage supply and the inductor are serially coupled and wherein the flying capacitor (Cf1 or Cf2) is coupled in parallel with the serially coupled input voltage supply and inductor; and wherein in the second state (MP or MN), the flying capacitor (Cf1 or Cf2) is coupled in series with at least one of the input voltage supply and the inductor.

Optionally, the signal amplifier has two modes of operation: a first mode (standard mode) during which the driver drives the network of switches between the neutral state (DL) and the first state (DP or DN), and a second mode (boosted mode) during which the driver drives the network of switches between the first state (DP (DN)) and the second state (MP (MN)).

Optionally, wherein in the first state (DP, DP2) the ground is coupled to ground via a path that includes the flying capacitor through the load.

Optionally, wherein in the second state (MP, MP2, MP3), the input port is coupled to the ground port via a first path comprising the flying capacitor and the load.

Optionally, wherein in the second state (MP, MP2), the input port is coupled to the ground port via two paths, the first path and a second path comprising the inductor.

Optionally, wherein the second state is a magnetization state to magnetize the inductor.

Optionally, wherein the first state is a positive state for providing a positive output voltage or a negative state for providing a negative output voltage.

Optionally, wherein the second state is a positive state for providing a positive output voltage or a negative state for providing a negative output voltage.

Optionally, wherein the power converter is a step-up power converter, or wherein the power converter is a step-down converter.

Optionally, the power converter is an inverting power converter.

Optionally, the signal amplifier is a multi-level class D amplifier.

Optionally, the H-bridge circuit comprises a pair of output terminals for providing the output modulated voltage to the load.

Optionally, the power converter comprises a first flying capacitor and a second flying capacitor.

Optionally, wherein in the first state (DP or DN), the input voltage supply and the inductor are serially coupled and wherein each one of the first flying capacitor (Cf1) and the second flying capacitor (Cf2) are coupled in parallel with the serially coupled input voltage supply and inductor; wherein in the second state (MP or MN), the first flying capacitor (Cf1) is coupled in series with the inductor and the input voltage supply.

Optionally, wherein the driver is adapted to drive the network of switches in a third state (BP, BN), wherein in the third state the first flying capacitor (Cf1) is coupled in series with the inductor and the input voltage supply, and wherein the second flying capacitor (Cf2) is coupled in parallel with the serially coupled input voltage supply and inductor.

Optionally, wherein the inductor has a first terminal coupled to the voltage supply, and a second terminal coupled to ground via a single switch (S8).

Optionally, wherein the inductor has a first terminal coupled to the voltage supply, and a second terminal coupled to ground via two switches (S7 and S8).

Optionally, wherein the inductor has a first terminal coupled to the flying capacitor, and a second terminal connected to ground.

Optionally, wherein the H bridge circuit is a full-bridge circuit or a half-bridge circuit.

Optionally, wherein the inductor has a first inductor terminal coupled to the input port and a second inductor terminal, and wherein the network of switches comprises an input switch (S6) for coupling the flying capacitor to the input port; a first ground switch (S7) for coupling the flying capacitor to ground; an inductor switch (S5) for coupling the flying capacitor to the second inductor terminal; and a second ground switch (S8) for coupling the inductor to ground.

Optionally, wherein the inductor has a first inductor terminal coupled to the input port and a second inductor terminal, and wherein the network of switches comprises a first inductor switch (S5) for coupling the first flying capacitor to the second inductor terminal; a first ground switch (S6) for coupling the first flying capacitor to ground; a second inductor switch (S3) for coupling the second flying capacitor to the second inductor terminal; a second ground switch (S8) for coupling the second flying capacitor to ground.

Optionally, the inductor has a first inductor terminal coupled to ground and a second inductor terminal, and wherein the network of switches comprises an input switch (S6) for coupling a first terminal of the flying capacitor to the input port; a first ground switch (S8) for coupling the first terminal of the flying capacitor to ground; a first inductor switch (S5) for coupling the first terminal of the flying capacitor to the second inductor terminal; and a second inductor switch (S7) for coupling a second terminal of the flying capacitor to the second inductor terminal.

According to a second aspect of the disclosure, there is provided a method of amplifying an input signal, the method comprising:

providing a network of switches between an input port, an output port and a ground port, the network of switches being arranged to form a power converter coupled to a H-bridge circuit, wherein the power converter comprises a flying capacitor and an inductor; the power converter being adapted to receive an input voltage from a voltage supply and to provide a converted voltage, and the H-bridge circuit being adapted to receive the converted voltage and to apply an output modulated voltage to a load;

providing a driver to operate the H-bridge circuit in a plurality of states for providing the output modulated voltage, the driver being adapted to drive the network of switches in a neutral state (DL), a first state (DP or DN) and a second state (MP or MN);

wherein in the neutral state no voltage is applied to the load; wherein in the first state (DP or DN), the input voltage supply and the inductor are serially coupled and wherein the flying capacitor (Cf1 or Cf2) is coupled in parallel with the serially coupled input voltage supply and inductor; and wherein in the second state (MP or MN), the flying capacitor (Cf1 or Cf2) is coupled in series with at least one of the input voltage supply and the inductor.

For instance, the network of switches may include switches of the power converter and switches of the H-bridge circuit.

The options described with respect to the first aspect of the disclosure are also common to the second aspect of the disclosure.

BRIEF DESCRIPTION OF THE DRAWINGS

The disclosure is described in further detail below by way of example and with reference to the accompanying drawings, in which:

FIG. 3 is a flow chart of a method for amplifying an input signal according to the disclosure;

FIG. 4 is a diagram of a signal amplifier according to the disclosure;

FIG. 21A shows the signal amplifier of FIG. 20 operating in a positive state DP;

FIG. 21B shows the signal amplifier of FIG. 20 operating in a negative state DN;

FIG. 21C shows the signal amplifier of FIG. 20 operating in a neutral state DL;

FIG. 21D shows the signal amplifier of FIG. 20 operating in the high positive state MP (magnetization state);

FIG. 21E shows the signal amplifier of FIG. 20 operating in the high negative state MN (magnetization state);

FIG. 21F shows the signal amplifier of FIG. 20 operating in the demagnetization positive state BP;

FIG. 21G shows the signal amplifier of FIG. 20 operating in the demagnetization negative state BN;

DETAILED DESCRIPTION

Figure 1:
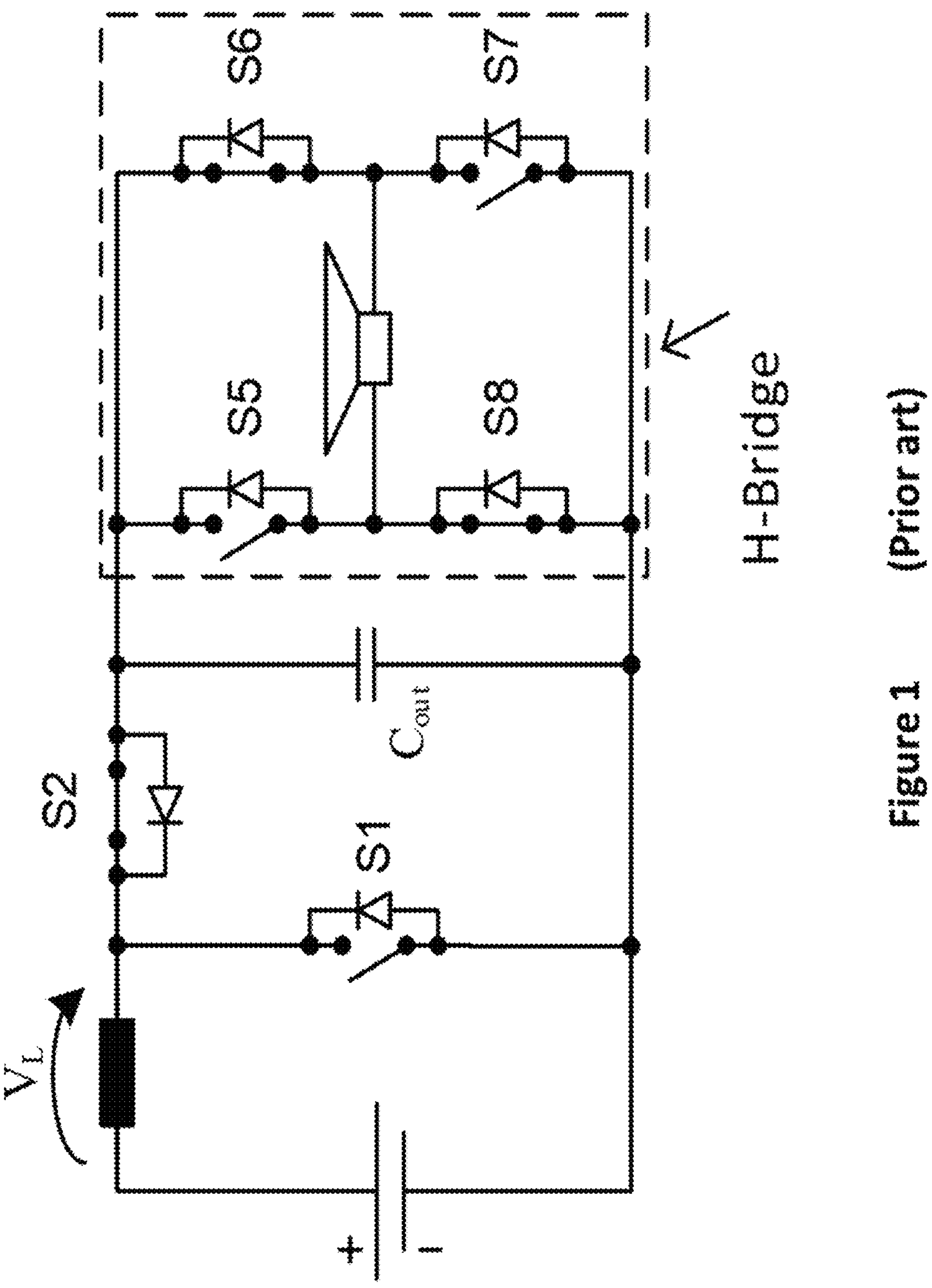
FIG. 1 is a diagram of a conventional H-bridge coupled to a switching boost converter.

FIG. 1 shows a simplified diagram of a H-bridge powered from a switching boost converter. Multi-level topologies are one attempt to improve the amplifier efficiency and to reduce the audio delay.

U.S. Pat. No. 8,643,436 presents two H-bridges connected in parallel. The first H-bridge is directly powered from the supply voltage and the second H-bridge is powered from the output of a step-up converter. This removes the delay typically required for slewing the supply voltage of the H-bridge in parallel to the envelope of the signal. Consequently, the H-bridge may instantaneously select the voltage level that is sufficient for the target amplitude of the output signal. In addition the pulsed output signal does no longer has to toggle just between a positive voltage and ground (2-level Class D or Half-bridge) or in case of a symmetric power supply (see for example Chen, "Embedded Single-Inductor Bipolar-Output DC-DC Converter in Class-D Amplifier for Low Common Noise", IEEE, 2016) between the positive amplifier supply voltage and ground or the negative supply voltage and ground (3-level Class D). The output can alternate between a boosted supply voltage and a non-boosted supply voltage (positive and negative in case of a symmetric topology), well known as Class G operation.

U.S. Pat. No. 9,515,617 describes the use of flying capacitors to implement intermediate sub-levels of the (boosted) supply voltage. The circuit presents output pulses with up to five different levels (5-level Class D) resulting to a smaller ripple in the stepped output signal, reducing not only the power loss in the amplifier but also the emission of EMI noise in comparison to prior art 2-and 3-level Class D. The reduced ripple of the output voltage typically enables the removal of bulky L-C filters, required especially at high output power for the reconstruction of the audio signal before routing it towards the loudspeaker load.

The EMI noise may be further reduced when increasing the number of (boosted) supply voltage sub-levels (See U.S. Ser. No. 10/284,155). A drawback of this approach is the increase of switches triggering a corresponding rise of the switching loss. The partial connection of four and more switches in series between the supply voltage and the loudspeaker load, cause larger conduction loss, especially during the provision of high output power.

Figure 2:
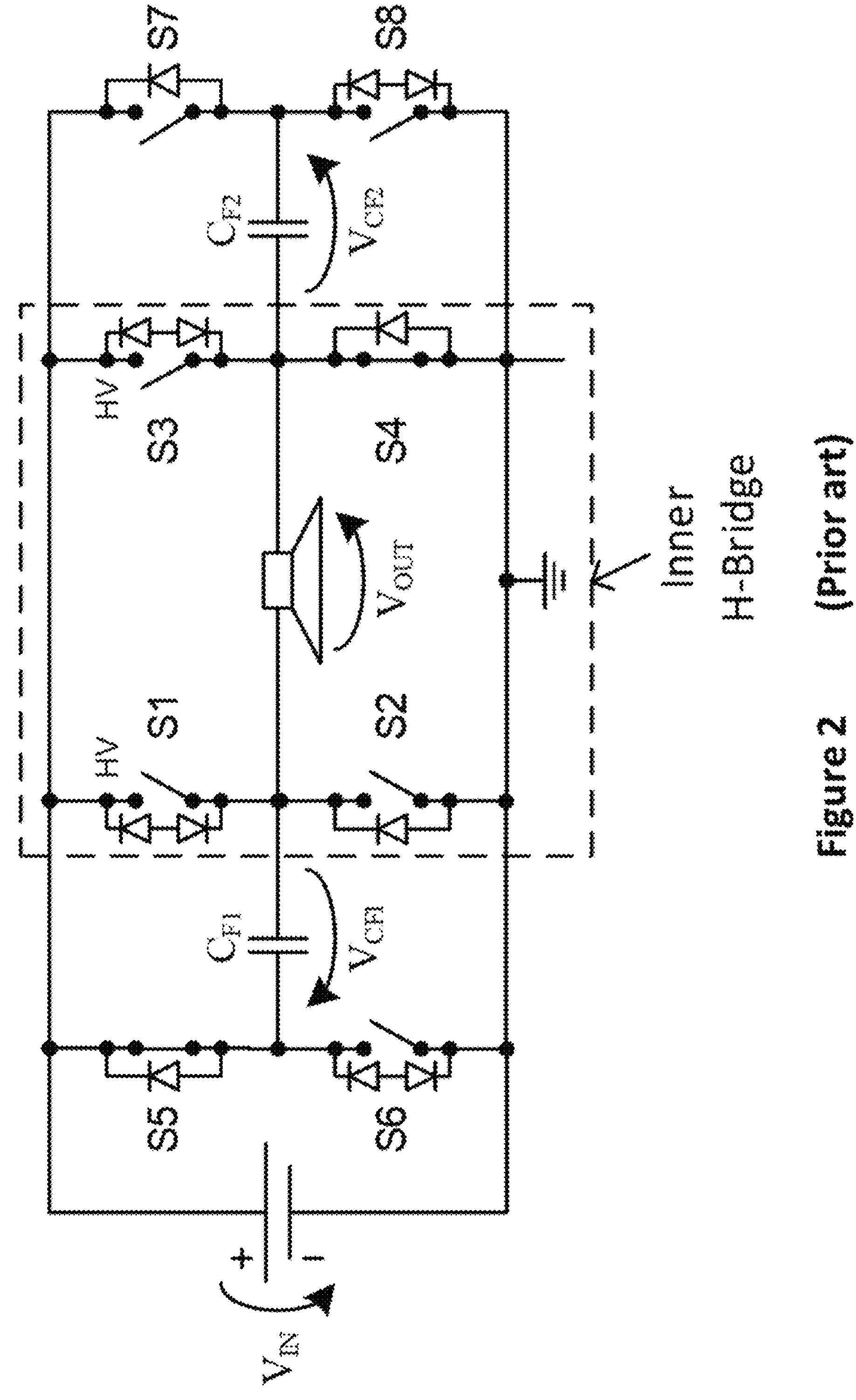
FIG. 2 is a diagram of an amplifier circuit according to the prior art.

FIG. 2 illustrates an amplifier circuit as described in U.S. Pat. No. 9,793,867. The circuit of FIG. 2 combines the supply voltage step-up conversion and the H-bridge into a unified switching circuitry. The number of switches connected in series is just two for any current path between the power supply and the loudspeaker load.

However, the top plate of the flying capacitors $C_{F1}$ and $C_{F2}$ provide throughout the switching sequence voltage levels which are above and below the positive port of the battery/power supply. Consequently, the switches S1 and S3 need to implement a back-to-back isolation. When using MOS-FETs (containing a parasitic body diode), this approach requires an anti-serial connection of two FETs (unless the MOS-FETs offer the capability to dynamically toggle the direction of the body diode). In a similar way, the bottom plate of the flying capacitors $C_{F1}$ and $C_{F2}$ provides voltage levels above and below the negative port of the battery/power supply, typically resulting to anti-serial connections of two FETs also for the switches S6 and S8. As a result, the effective number of serial FETs is increased. The topology of FIG. 2 increases the supply voltage of the H-bridge only by a factor less than 2:1.

The voltage drop from switch impedance results and loss from non-adiabatic charge redistribution causes a drop of the voltage across the flying capacitor and a saturation of the maximum output amplitude. At duty cycles above 70% the output voltage of a loaded capacitive step-up converter may even start to drop. As a result, the practical maximum amplifier output amplitude is less than 1.5× the supply voltage, which is typically not enough for the peaks of typical audio signals.

U.S. Pat. No. 9,793,867 describes a derivative topology that implements a supply voltage step-up conversion ratio targeting 3:1, with an unsaturated maximum output amplitude around 2× the supply voltage. It only connects two switches in series but requires an increased number of switches and four flying capacitors, hence increasing cost and size. An alternative topology with the same maximum voltage step-up ratio but less switches requires only two flying capacitors but partially connects four switches in series, some requiring a back-to-back isolation. Other topologies remove the need for back-to-back isolation and reduce the total number of switches from twelve to ten but require four switches connected in series for all current paths between the power supply and the loudspeaker load.

From customer expectation an efficient Multi-Level Class D Amplifier with a maximum output amplitude close to 3× the voltage supply voltage is desired, implementing a reduced number of serially connected switches in between the power supply and the loudspeaker load.

There is therefore a need for an efficient Multi-Level Class D Amplifier with a maximum output amplitude close to 3× the voltage supply voltage, implementing a reduced number of serially connected switches in between the power supply and the loudspeaker load.

FIG. 3 is a flow chart of a method for amplifying an input signal according to the disclosure.

At step 310 a network of switches is provided between an input port, an output port, and a ground port. The network of switches is arranged to form a power converter coupled to a H-bridge circuit. The power converter comprises a flying capacitor and an inductor. The power converter is adapted to receive an input voltage from a voltage supply and to provide a converted voltage. The H-bridge circuit is adapted to receive the converted voltage and to apply an output modulated voltage to a load. For instance, the load may be a loudspeaker. The output modulated voltage may be formed of width modulated pulses of the converted (input) voltage.

At step 320 a driver is provided to operate the H-bridge circuit in a plurality of states for providing the output modulated voltage. Providing the output modulated voltage may include generating the width and level of the output modulated voltage. The driver is adapted to drive the network of switches in a neutral state, a first state and a second state. In the neutral state no voltage is applied to the load. In the first state, the input voltage supply and the inductor are serially coupled. The flying capacitor is coupled in parallel with the serially coupled input voltage supply and inductor. In the second state, the flying capacitor is coupled in series with at least one of the input voltage supply and the inductor.

FIG. 4 is a diagram of a signal amplifier according to the disclosure. The signal amplifier 400 is a multi-level class D amplifier that includes power converter (in this example a step-up converter) coupled to a H-bridge circuit. A network of eight switches (S1-S8) is arranged to form the power converter and the H-bridge circuit.

The signal amplifier 400 has three ports: an input port (I), a differential H-bridge output port (A/B) for providing an output modulated voltage to a load; and a ground port. An input voltage supply, for instance a battery, is provided between the input port I and ground for providing an input voltage $V_{IN}$.

The power converter is a hybrid converter for performing both capacitive and inductive conversion; it includes a flying capacitor $C_F$ (terminals provided with varying voltages) and an inductor L. The flying capacitor $C_F$ has a first terminal coupled to the input node I via switch S6 and to ground via switch S7, and a second terminal coupled to node O. The inductor L has a first terminal coupled to the input node I and a second terminal coupled to node O via switch S5, and to ground via switch S8. The power converter is adapted to receive the input voltage $V_{IN}$ and to provide a converted voltage.

The H-bridge circuit has a first output (positive port A) coupled to a first terminal of the load and a second output (negative port B) coupled to a second terminal of the load. The first output A is coupled to the output of the step-up converter at node O via switch S1 and to ground via switch S2. Similarly, the second output B is coupled to node O via switch S3 and to ground via switch S4. The H-bridge circuit is adapted to receive the converted voltage and to provide the output modulated voltage to the load, in this example a speaker.

A driver 420 is provided to toggle the H-bridge circuit between multiple states for providing the output modulated voltage. The driver is adapted to drive the network of switches in a neutral state (DL), a first state (DP or DN) and a second state (MP or MN). In the neutral state (DL) no voltage is applied to the load. In the first state (DP or DN), the input voltage supply and the inductor are serially coupled. The flying capacitor is coupled in parallel with the serially coupled input voltage supply and inductor. In the second state (MP or MN), the flying capacitor is coupled in series with at least one of the input voltage supply and the inductor.

The multi-level class D amplifier 400 has two modes of operation: a first mode also referred to as standard mode, and a second mode also referred to as boosted mode.

Figures 5A, 5B, 5C:
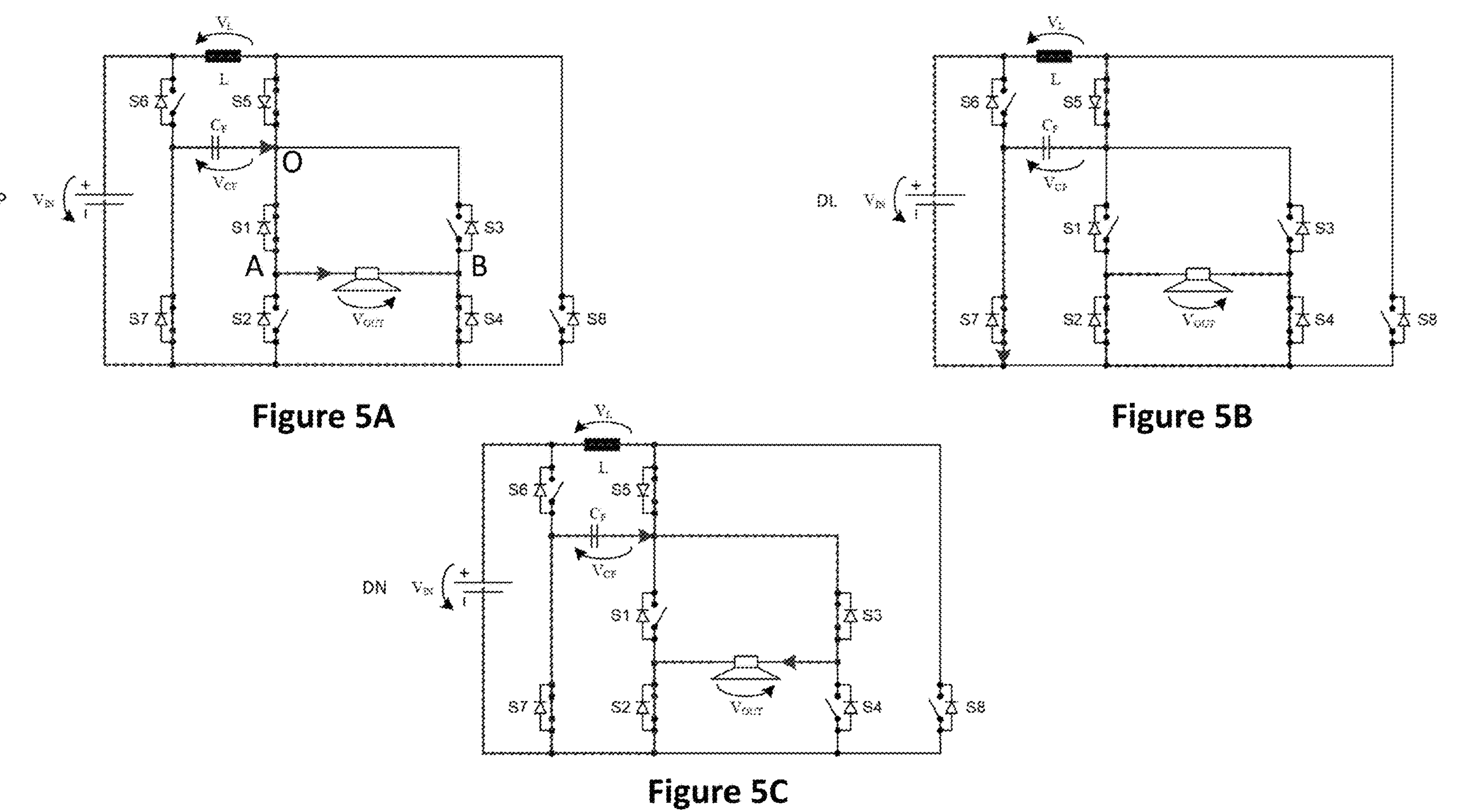
FIG. 5A illustrates the circuit of FIG. 4 operating in a positive state DP.
FIG. 5B illustrates the circuit of FIG. 4 operating in a neutral state DL.
FIG. 5C illustrates the circuit of FIG. 4 operating in a negative state DN.

FIGS. 5A-5C illustrate three states DP, DL, DN of the first mode (standard mode).

FIG. 5A shows the amplifier 400 of FIG. 4 operating in the state DP also referred to as positive state. The switches S1, S4, S5, S7 are closed and the remaining switches S2, S3, S6 and S8 are open. The input port (I) is coupled to ground via a path that includes L, S1, S4 through the load. The ground is coupled to ground via a path that includes S7, $C_F$, S1, S4 through the load. The flying capacitor $C_F$ is connected in parallel with the voltage supply through the inductor L. The voltage applied to the positive terminal of the H Bridge (node A) is $V_{CF}$~$V_{IN}$. This is because on average the voltage $V_L$ across the inductor is zero. The state DP is used to generate a positive pulse width module (PWM) signal.

FIG. 5B shows the amplifier 400 of FIG. 4 operating in a state DL also referred to as neutral state. The switches S2, S4, S5, S7 are closed and the remaining switches S1, S3, S6 and S8 are open. The flying capacitor $C_F$ is connected in parallel with the voltage supply through the inductor L. Since the switch S1 is open, the voltage applied to the positive terminal of the H Bridge (node A) is zero. The state DL is used to generate a zero PWM signal.

FIG. 5C shows the amplifier 400 of FIG. 4 operating in a state DN also referred to as negative state. The switches S2, S3, S5, S7 are closed and the remaining switches S1, S4, S6 and S8 are open. The flying capacitor $C_F$ is connected in parallel with the voltage supply through the inductor L. The voltage applied across the H Bridge (node A) is a negative voltage $-V_{CF}=-V_{IN}$. The current flowing through the speaker is in the opposite direction (reversed polarity) and the voltage is also reversed. The state DN is used to generate a negative PWM signal.

In the region for low output voltage, for instance below the level of the input voltage, the multi-level class D amplifier 400 toggles between DP and DL for positive PWM pulses or between DN and DL for negative PWM pulses. Consequently, the amplifier operates between three voltage levels $+V_{IN}/0/-V_{IN}$. For input signals with positive polarity, the H-bridge drives its differential output during the positive state DP towards the voltage level $V_{CF}$ of the flying capacitor $C_F$ and for the neutral state DL to zero.

When applying the volt-sec balance principle to the voltage across the inductance of the loudspeaker load the average (low pass filtered) differential voltage $V_{OUT}$ across the resistance of the loudspeaker $R_{LSP}$ is determined by the relative duty cycle D of the state DP as:

$$V_{OUT} = DV_{IN} \quad \Delta t_{DP} = D, \Delta t_{DL} = 1 - D \quad D \in [0, 1] \tag{1}$$

During the first (standard) mode of operation, the average voltage across the capacitor $C_F$ is equal to the input voltage ($V_{CF}=V_{IN}$). The inductor L implements a low pass filter suppressing switching noise otherwise injected into the supply rail $V_{IN}$ from the pulsed input current of the H-bridge.

The second mode (boosted mode) uses the states DP, DN and additionally the states MP and MN, referred to as High positive state and High negative state, respectively. In this context the states DP and DN are referred to as Low positive state and Low negative states.

Figure 6B:
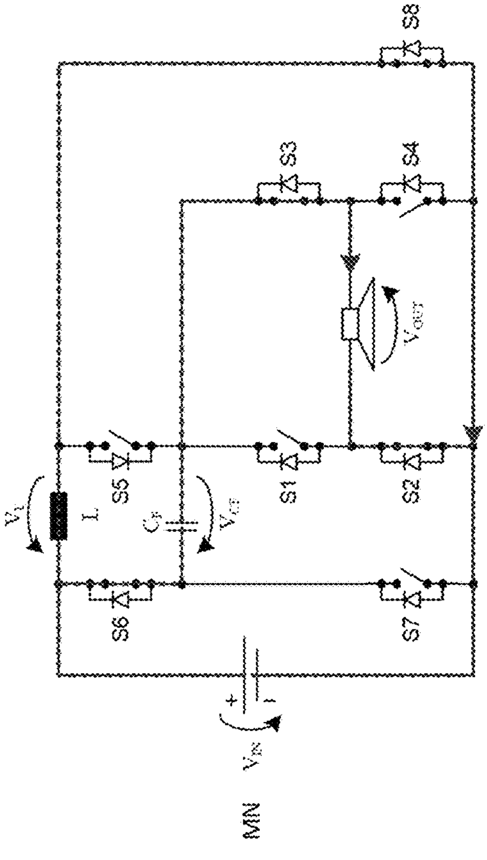
FIG. 6B illustrates the circuit of FIG. 4 operating in a high negative state MN.
Figure 6A:
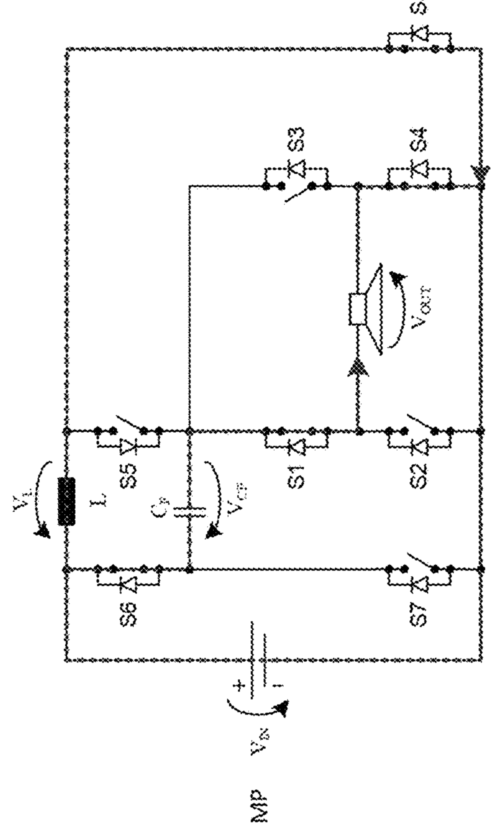
FIG. 6A illustrates the circuit of FIG. 4 operating in a high positive state MP.

FIG. 6A shows the amplifier 400 of FIG. 4 operating in the state MP, also referred to as High positive state. The switches S1, S4, S6, S8 are closed and the remaining switches S2, S3, S5 and S7 are open.

The input port (I) is coupled to the ground port via a first path comprising the flying capacitor and the load, and a second (magnetization path) path comprising the inductor. The flying capacitor $C_F$ is connected in series with the voltage supply. The voltage applied to the positive terminal of the H Bridge (node A) is $V_{CF}+V_{IN}$ (path S6/CF/S1/S4). The state MP is used to generate a positive pulse-width modulated (PWM) signal. In addition, the inductor L is also magnetised via the magnetisation path coupling the voltage supply to ground via the inductor L and the switch S8.

FIG. 6B shows the amplifier 400 of FIG. 4 operating in the state MN, also referred to as High negative state. The switches S2, S3, S6, S8 are closed and the remaining switches S1, S4, S5 and S7 are open. The flying capacitor $C_F$ is connected in series with the voltage supply. The voltage applied to the negative terminal of the H Bridge (node B) is $-(V_{CF}+V_{IN})$ (path S6/CF/S3/S2). The state MN is used to generate a negative pulse-width modulated (PWM) signal. In addition, the inductor L is also magnetised via a magnetisation path coupling the voltage supply to ground via the inductor L and the switch S8.

In the region with high out voltage, for instance above the level of the input voltage, the amplifier output voltage toggles between the levels of the DP and MP states. That is between $+V_{IN}$ and $+(V_{CF}+V_{IN})$. If the duty cycle of MP is increased, then $V_{CF}$ also increases (due to a longer magnetization of the inductor L) so the level$+(V_{CF}+V_{IN})$ also increases. Therefore, for high output power, the multi-level class D Amplifier 400 operates like a 5-Level Class D Amplifier, but with an output amplitude that is dependent on HIGH and LOW pulse levels. For input signals with positive polarity the amplifier drives its output at the HIGH switching state MP to the upper boosted supply voltage ($V_{MP}=V_{IN}+V_{CF}$) and for the LOW state DP to the lower boosted supply voltage ($V_{DP}=V_{CF}$).

The relationship between the output voltage $V_{DP}$ and the input voltage $V_{IN}$ is obtained by applying the volt-sec balance principle to the voltage across the inductor L and the charge balance principle to the flying capacitor $C_F$ (the flying capacitor $C_F$ is re-charged during the switching state DP of the boosted Class D operation):

$$V_{DP} = V_{CF} = \frac{V_{IN}}{1-D} \quad \Delta t_{MP} = D, \Delta t_{DP} = 1-D \quad D \in [0,1] \tag{2}$$

This output voltage matches with the well-known formula for a traditional inductive boost converter. The output voltage $V_{MP}$ during the switching HIGH state MP is derived from:

$$V_{MP} = V_{IN} + V_{CF} = \frac{(2-D)}{1-D} V_{IN} \quad \Delta t_{MP} = D, \Delta t_{DP} = 1-D \quad D \in [0,1] \tag{3}$$

By considering the relative duty cycle of the switching states MP and DP the average (low pass filtered) differential voltage $V_{OUT}$ across the terminals of the loudspeaker load may be derived from:

$$V_{OUT} = \frac{(1+D-D^2)}{1-D} V_{IN} \quad \Delta t_{MP} = D, \Delta t_{DP} = 1-D \quad D \in [0,1] \tag{4}$$

The delta between two adjacent switching states of the H-bridge may be (independent from the output voltage) less than $V_{IN}$ (during standard and boosted Class D operation modes). This reduces input current ripple and noise disturbance from EMI.

Figure 7:
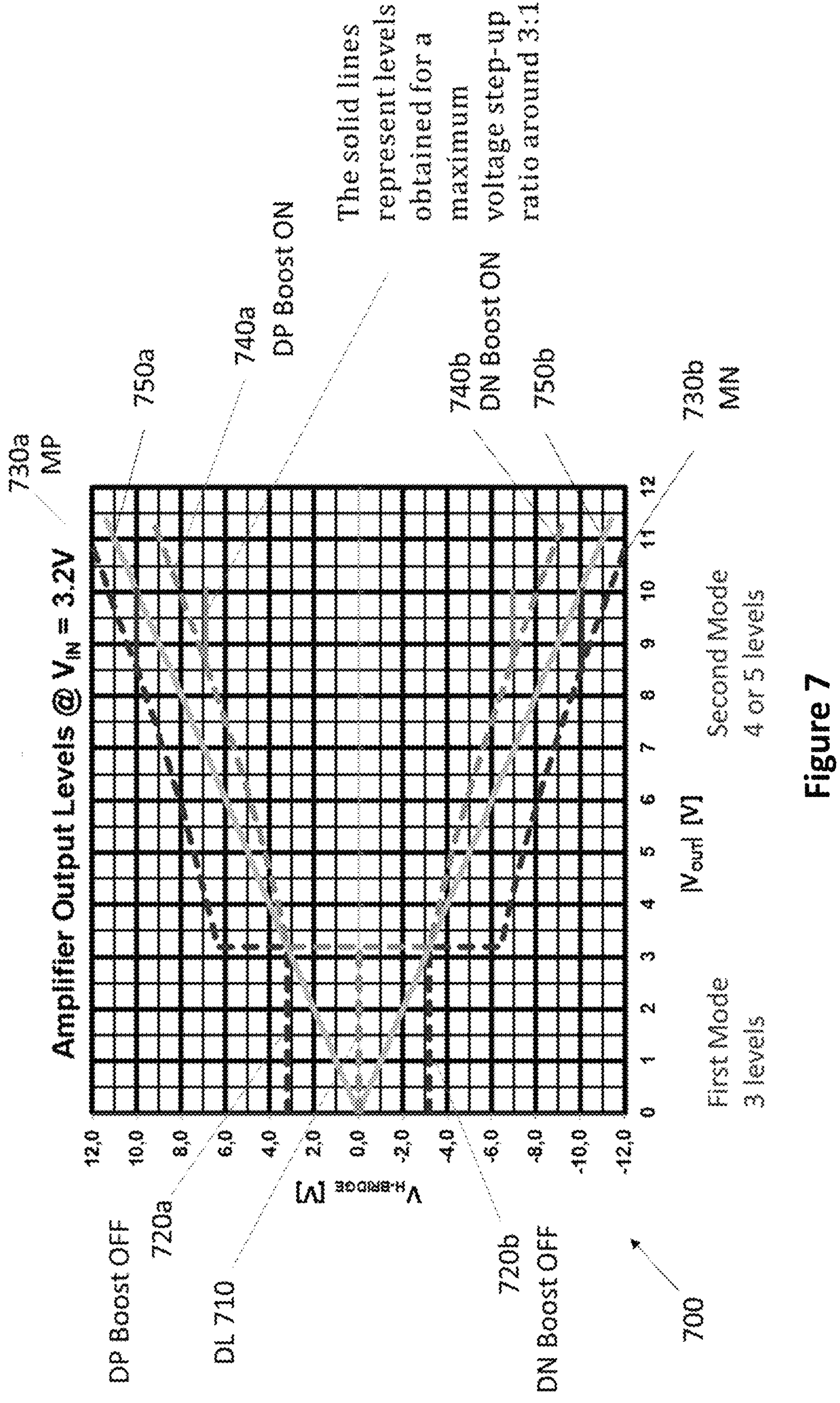
FIG. 7 is a simulation showing the H-bridge output pulse levels when the signal amplifier of FIG. 4 is operating in a first (standard) mode and a second (boosted) mode.

FIG. 7 is a simulation showing the H-bridge output pulse levels when the signal amplifier is operating in a first (standard) mode and a second (boosted) mode. The plot also shows the average voltage across the resistance of the loudspeaker. The simulation is provided for an input voltage $V_{IN}$=3.2V.

Waveform 710 shows the H-bridge voltage in the neutral state DL (VDL=0).

Waveform 720*a* shows the H-bridge voltage in the positive state DP with boost converter OFF, no inductor magnetization (VDP=$V_{CF}$=$V_{IN}$).

Waveform 720*b* shows the H-bridge voltage in the negative state DN with boost converter OFF (VDN=$-V_{CF}$=$-V_{IN}$).

Waveform 730*a* shows the H-bridge voltage in the HIGH positive state MP ($V_{MP}=V_{CF}+V_{IN}$). $V_{CF}$ increases with the output of the boost converter.

Waveform 730*b* shows the H-bridge voltage in the HIGH negative state MN (VMN=$-(V_{CF}+V_{IN})$).

Waveform 740*a* shows the H-bridge voltage in the positive state DP with boost converter ON (VDP=$V_{CF}$). In this case, $V_{CF}$ increases with the output of the boost converter.

Waveform 740*b* shows the H-bridge voltage in the negative state DN with boost converter ON (VDN=$-V_{CF}$).

Waveform 750*a* shows the average signal H-bridge voltage when operating between DP and DL in the first mode and between MP and DP in the second mode. Waveform 750*b* shows the average signal H-bridge voltage when operating between DN and DL in the first mode and between MN and DN in the second mode. This voltage (750*a*, 750*b*) corresponds to the voltage across the resistance of the loudspeaker.

Below a transition output voltage (in this example about 3V), the signal amplifier operates in the first mode between 3 levels: $V_{IN}$=3.2V (state DP with boost converter OFF), $-V_{IN}$=−3.2V (state DN with boost converter OFF) and 0V (state DL).

For the positive polarity, as the output voltage Vout increases, the duty cycle of state DP increases and the duty cycle of state DL decreases. At the transition output voltage (about 3V) the duty cycle of DP is 100% and duty cycle of DL is 0%. The average signal H-bridge voltage (waveform 750*a* shows) increases linearly. The same occurs for the negative polarity with states DN and DL in connection to waveform 750*b*.

At the transition output voltage, the voltage $V_{MP}=V_{CF}+V_{IN}=2\ V_{IN}$ (with $V_{CF}=V_{IN}$).

Above the transition output voltage, the signal amplifier operates in the second mode between 4 levels: i) HIGH positive state MP ($V_{MP}=V_{CF}+V_{IN}$), ii) positive state DP with boost converter ON (VDP=$V_{CF}$), iii) HIGH negative state MN (VMN=−($V_{CF}$+$V_{IN}$)), iv) negative state DN with boost converter ON (VDN=−$V_{CF}$).

For the positive polarity, at the transition output voltage (about 3V) the duty cycle of DP is 100% and duty cycle of MP is 0%. As the output voltage Vout keeps increasing, the duty cycle of state MP increases and the duty cycle of state DP decreases. The average signal H-bridge voltage (waveform 750*a* shows) increases linearly. The same occurs for the negative polarity with states MN and DN in connection to waveform 750*b*.

It will be appreciated that the second mode could also include an additional level by including the neutral state DL.

Figure 8:
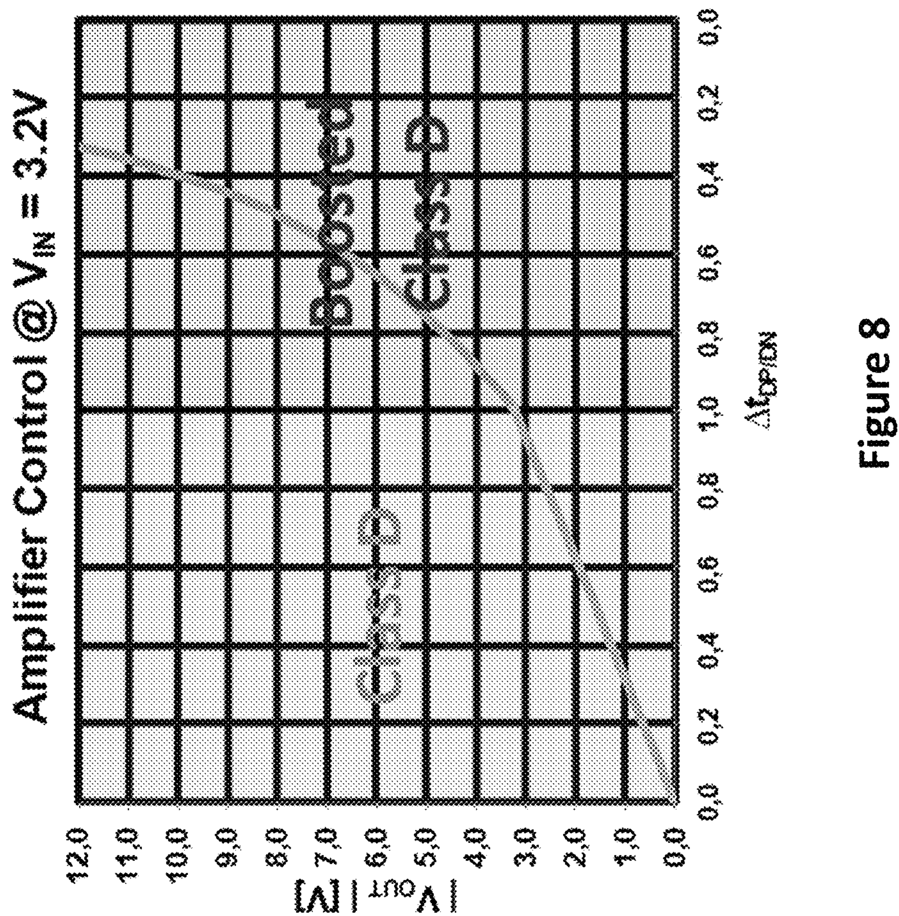
FIG. 8 is a plot showing the output voltage Vout as a function of a duty cycle ratio of the states DP and DN.

FIG. 8 is a plot showing the output voltage Vout as a function of a duty cycle ratio of the states DP and DN $\Delta t_{DP/DN}$. When the average output voltage is equal to the input voltage, the control of the H-bridge selects the switching state DP at a duty cycle of $\Delta t_{DP/DN}$=1. The duty cycle $\Delta t_{DP/DN}$ shown on the horizontal axis increases from 0 to 1 for the Class D operation and decreases from 1 to 0 for the boosted Class D operation. When using standard Class D operation, the relative interval of the switching state DP/DN is proportionally decreased for lower target output voltages. When using boosted Class D operation, the relative interval of switching states DP/DN is decreased for higher target output voltages.

Figure 9:
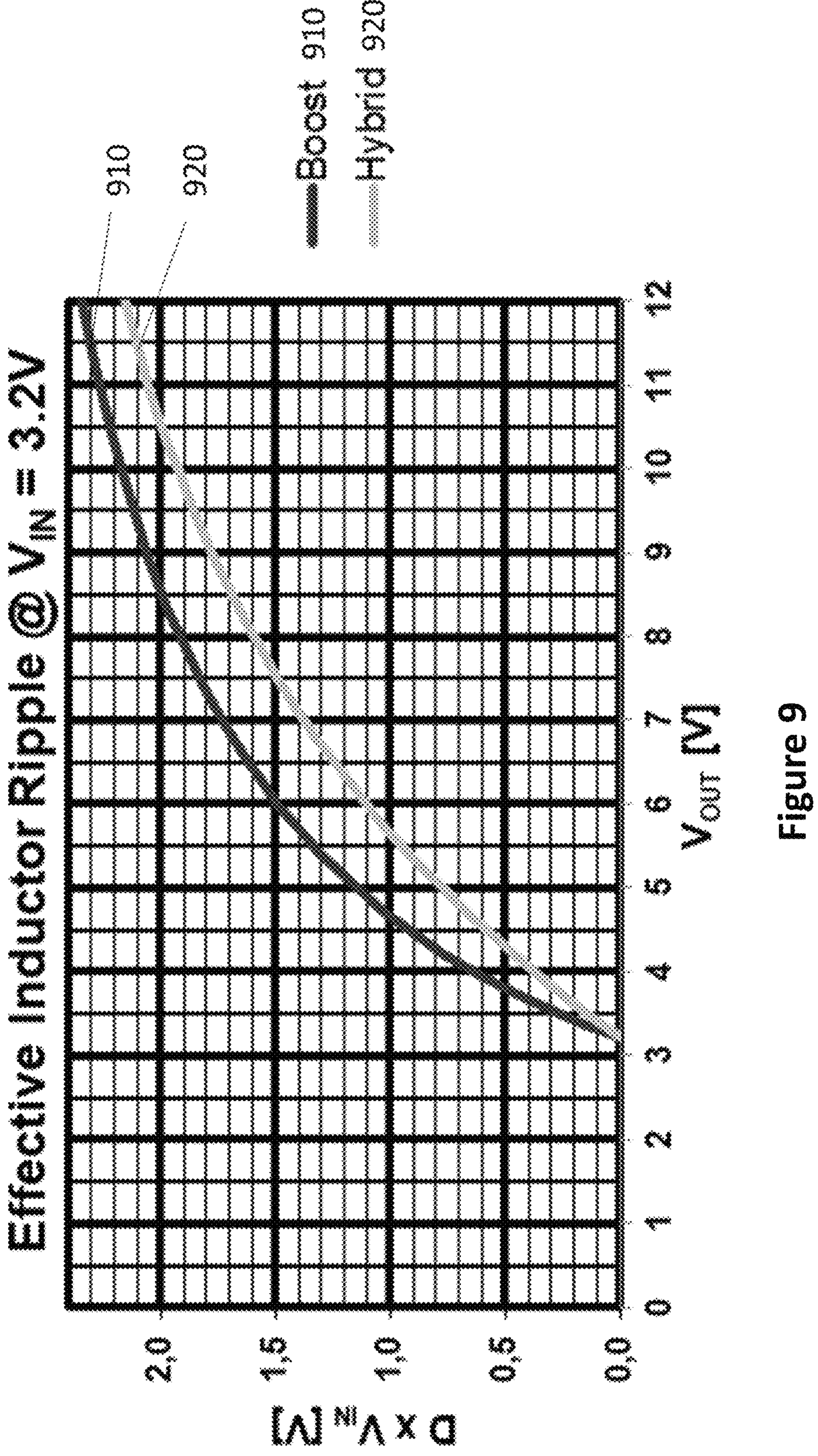
FIG. 9 illustrates the effective inductor ripple as a function of the output voltage.

FIG. 9 illustrates the effective inductor ripple as a function of the output voltage. The inductor of a switching boost converter is typically exposed to a delta voltage in the range of $V_{OUT}$−$V_{IN}$. However, the hybrid step-up converter increases via the flying capacitor the output voltage during the state MP/MN with the additional level of $V_{IN}$. As a result, the effective inductor volt-sec ripple D×$V_{IN}$ of the hybrid step-up converter 920 is reduced compared with the effective ripple of a traditional inductive boost converter 910 providing the same upper output voltage level. This enables the selection of an inductor with a reduced saturation current rating or, if implementing the same inductor current ripple, a selection of a lower inductance or a lower switching frequency, both improving amplifier efficiency.

Figure 10:
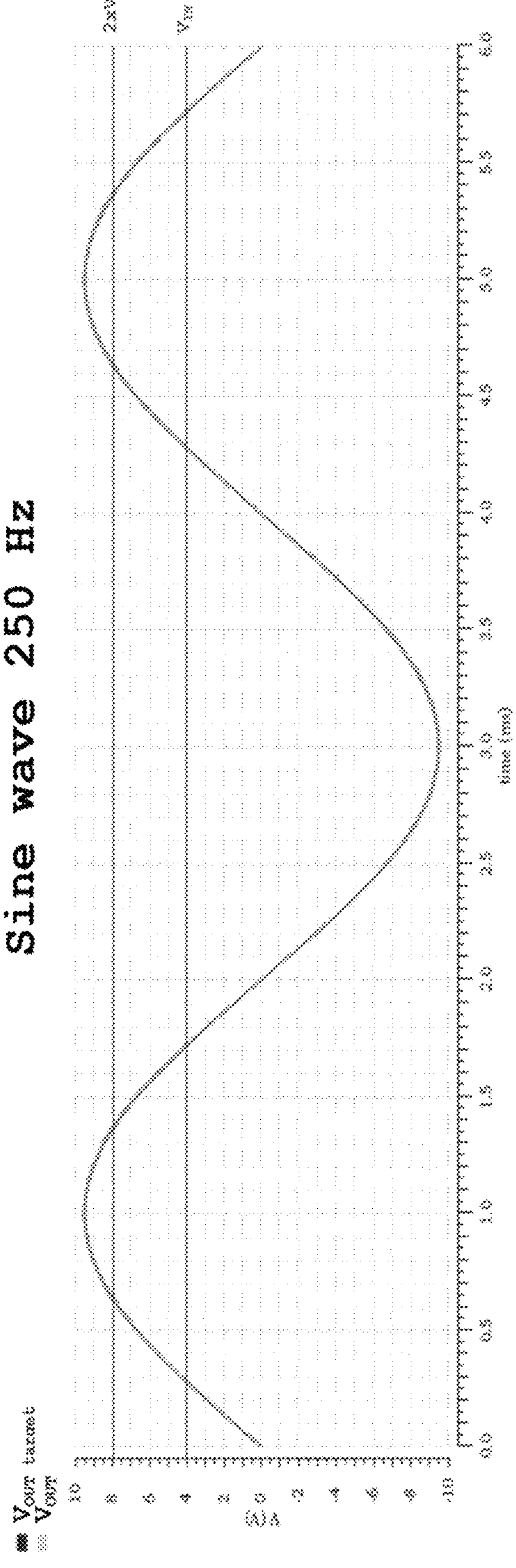
FIG. 10 is a simulation of the target output voltage and the output voltage obtained using the topology of FIG. 4.

FIG. 10 is a simulation of the target output voltage and the output voltage obtained using the topology of FIG. 4. The simulation was performed for an audio signal having an amplitude larger than twice the power supply voltage $V_{IN}$. The target output voltage and the output voltage obtained overlap. Depending on the application, the states MP, MN, DP, DN and DL may be replaced at least partially by other states.

Figures 11A, 11B:
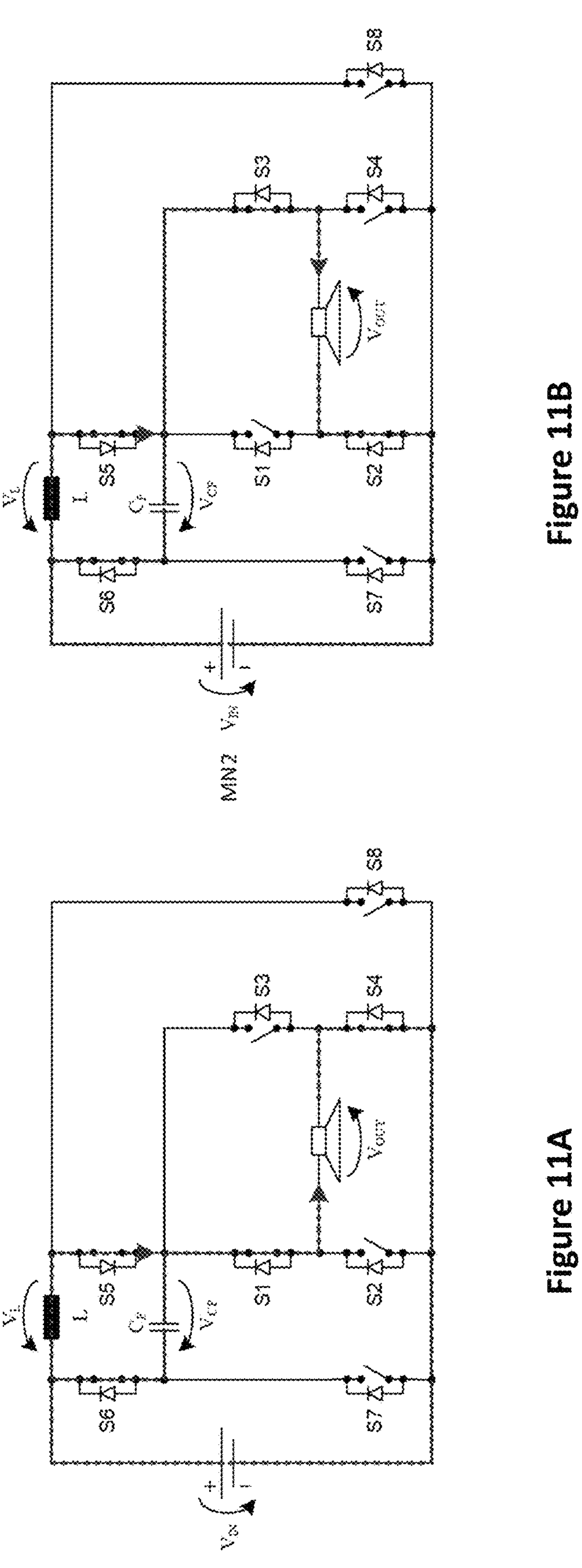
FIG. 11A illustrates the circuit of FIG. 4 operating in another high positive state MP2.
FIG. 11B illustrates the circuit of FIG. 4 operating in another high negative state MN2.

FIG. 11A shows a state MP2 that may be used to replace the state MP. For advanced battery management, the switching state MP may partially be replaced with the state MP2.

For instance, the original MP state may be split into two sub-states, so that a sequence may be DP/MP/MP2/DP/MP/MP2/DP . . . . This reduces the duty cycle of inductor magnetization, so that the voltage across the flying capacitor increases less with the output voltage.

The state MP2 is like the state MP described in FIG. 6A, however in this state the switch S8 is open and the switch S5 is closed instead of switch S8. The input port (I) is coupled to the ground port via two paths: a first path comprising S6, $C_F$, S1, S4, through the load and a second (de-magnetization) path that includes L, S5, S1 and S4, through the load.

This reduces inductor magnetization and decreases the voltage $V_{CF}$ across the flying capacitor $C_F$. This removes the amplifier input current, otherwise required for further slewing up the voltage of the flying capacitor $C_F$ (see solid lines in FIG. 7 for the example of a maximum voltage step-up ratio around 3:1). Close to the maximum output power of the amplifier such operation reduces peaks in the battery load current and improves amplifier efficiency via an increased duty cycle of the H-bridge.

FIG. 11B shows a state MN2 that may be used to replace the state MN. The state MN2 is like the state MN described in FIG. 6B, however in this case the switch S5 is closed instead of switch S8. The input port (I) is coupled to ground via a first path that includes S6, $C_F$, S3, S2 through the load, and a second (de-magnetization) path that includes L, S5, S3 and S2 through the load.

Figures 12A, 12B, 12C:
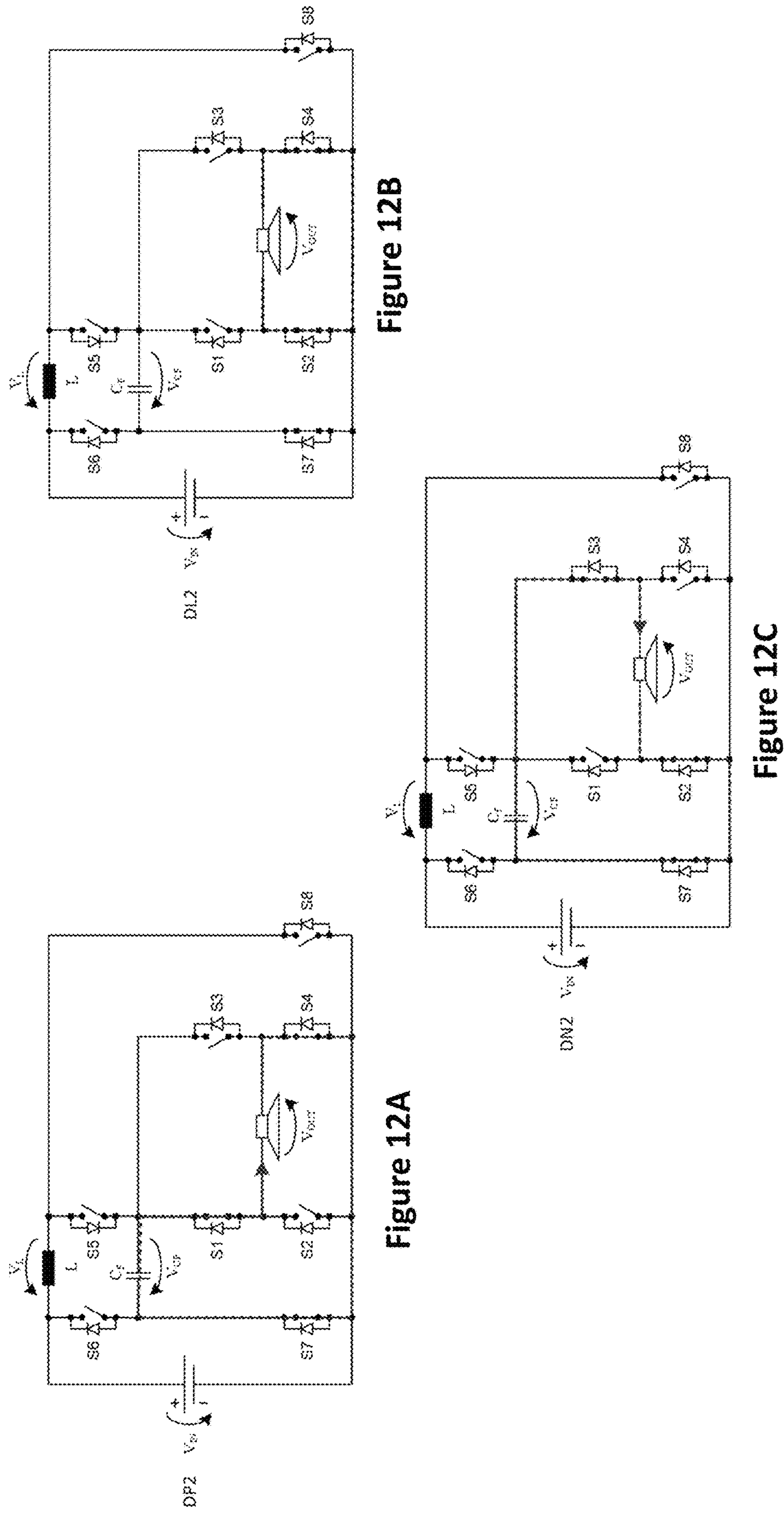
FIG. 12A illustrates the circuit of FIG. 4 operating in another positive state DP2.
FIG. 12B illustrates the circuit of FIG. 4 operating in another neutral state DL2.
FIG. 12C illustrates the circuit of FIG. 4 operating in another negative state DN2.

FIG. 12A shows a state DP2 that may be used to replace the state DP. The state DP2 is like the state DP described in FIG. 5A, however in this case the switch S5 is open. The ground is coupled to ground via a path that includes S7, $C_F$, S1 and S4 through the load.

FIG. 12B shows a state DL2 that may be used to replace the state DL. The state DL2 is like the state DL described in FIG. 5B, however in this case the switch S5 is open. The ground is coupled to ground via a path that includes S2 and S4 through the load.

FIG. 12C shows a state DN2 that may be used to replace the state DN. The state DN2 is like the state DN described in FIG. 5C, however in this case the switch S5 is open.

The ground is coupled to ground via a path that includes S7, $C_F$, S3 and S2 through the load.

For applications with low sensitivity to amplifier output voltage ripple the H-bridge may switch to standard Class D operation when the target average output voltage has dropped below the level of $V_{CF}$. If a discharge of the flying capacitor towards the input rail $V_{IN}$ is not desired, the modified states DP2, DN2 and DL2 described in FIG. 12 may be selected after the current $I_L$ through the inductor L has reached zero. In standard Class D operation, a typical sequence may be DP/DL/DP/DL/DP or DN/DL/DN/DL/DN. A continuous closure of switch S5 will discharge $C_F$ through the inductor to the level of Vin. When $C_F$ should be discharged by the load current instead, the states DP2, DN2 and DL2 may replace the states DP, DN and DL after the current through the inductor has reached zero.

For applications with a target output voltage ripple below the level of $V_{IN}$, the switching state MP may be replaced with MP2 to accelerate the discharge of the flying capacitor $C_F$. Depending on the target slewing rate of the output voltage $V_{OUT}$ compared with the time constant $T=R_{LSP}C_F$ ($R_{LSP}$: loudspeaker resistance), the state MP2 may implement a negative inductor current $I_L$ with a discharge of the flying capacitor $C_F$ into the supply rail $V_{IN}$ (during the switching states DP and DN). This may be avoided via switching state MP3.

Figure 13B:
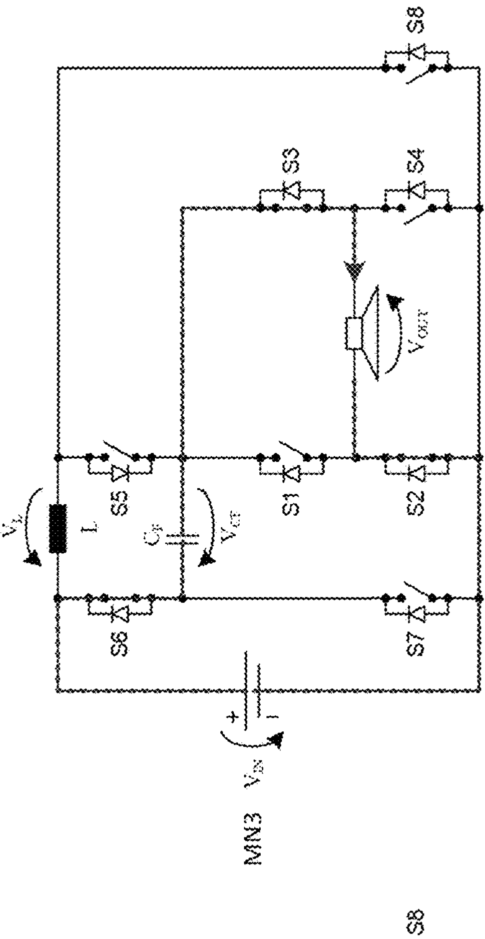
FIG. 13B illustrates the circuit of FIG. 4 operating in yet another high negative state MN3.
Figure 13A:
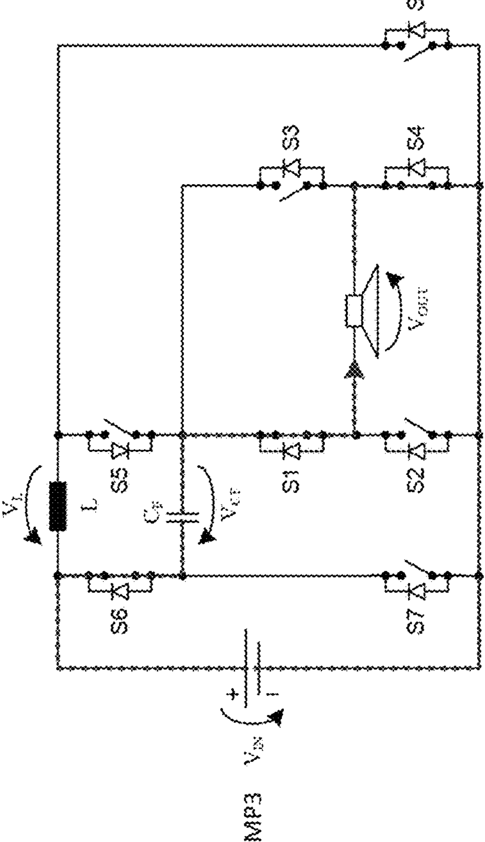
FIG. 13A illustrates the circuit of FIG. 4 operating in yet another high positive state MP3.

FIG. 13A shows another state MP3 that may be used to replace the state MP or MP2. The state MP3 is like the state MP described in FIG. 6A or state MP2 described in FIG. 11A, however in this state both switches S5 and S8 are open. The input port (I) is coupled to the ground port via a single path comprising S6, $C_F$, S1 and S4, through the load.

This switching state MP3 may replace switching state MP or MP2 after the inductor current $I_L$ has reached zero (similar to the modified switching states DP2, DN2 and DL2). The state MP3 may also fully replace the switching state MP2 with the drawback that (fast) ramp-down of the inductor current $I_L$ is implemented via the body diode of switch S5. This slightly increases the power loss of the circuit. However, considering the rare occurrence of audio signal peaks within the upper 6 dB, the impact to the drain of the battery is typically negligible. The same procedure may be implemented for negative output voltages when replacing the switching state MN with the switching states MN2 and/or MN3 described in FIGS. 11B and 13B, respectively.

A fast discharge of the flying capacitor $C_F$ improves the accuracy of signal tracking, effectively implementing an amplifier topology well known as Class H. Especially at high output power this removes power loss of a H-bridge operating within traditional Multi-Level (Class G) Amplifiers at low duty cycle because the average output voltage is just slightly above the level of a discrete supply voltage step.

In the topology of FIG. 4 the number of switches connected in series between the power supply and the loudspeaker load is three (S6, S1, S4). The Hybrid Class D Amplifier of the disclosure combines the advantages of multi-level-switching and signal tracking Class H operation with the benefits of hybrid voltage step-up conversion. Various topologies can be considered.

Figure 14:
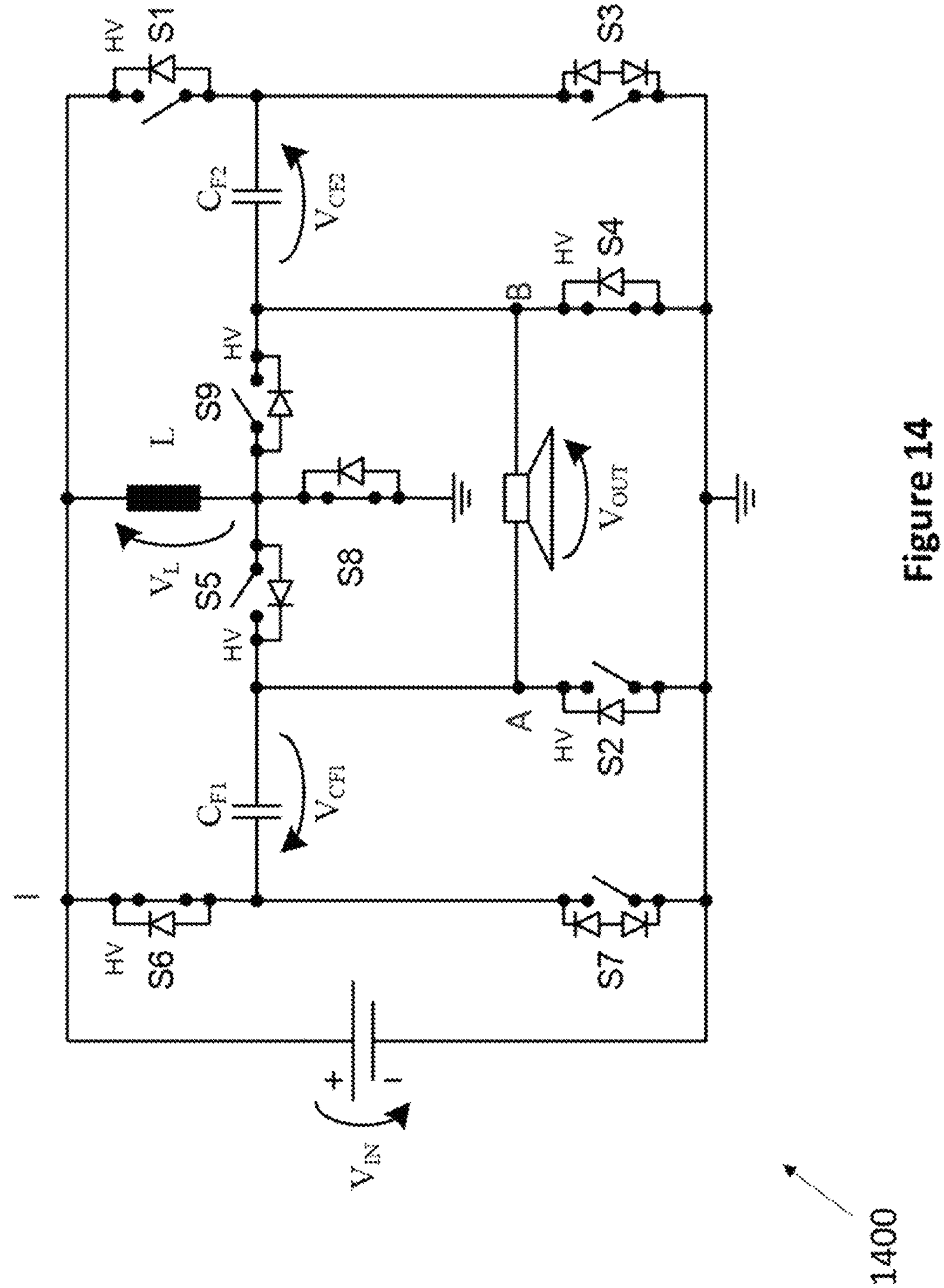
FIG. 14 is a diagram of another signal amplifier having a reduced number of serially connected switches.

FIG. 14 shows a diagram of another signal amplifier according to the disclosure having a reduced number of serially connected switches.

The signal amplifier 1400 includes two flying capacitors $C_{F1}$ and $C_{F2}$ which can be operated independently. This topology requires one additional flying capacitor $C_{F2}$ and one additional switch S9, but the principle of operation remains similar as described for the topology of FIG. 4.

Within the switching sequence the bottom plate voltage level of the flying capacitors $C_{F1}$ and $C_{F2}$ may reach levels above and below ground level. When using MOS-FETs transistors the switches S3 and S7 may have to be implemented via two FETs connected in series (anti-serial). The switches S1 and S6 may require a voltage rating sufficient to sustain an increased maximum voltage level.

Figure 15:
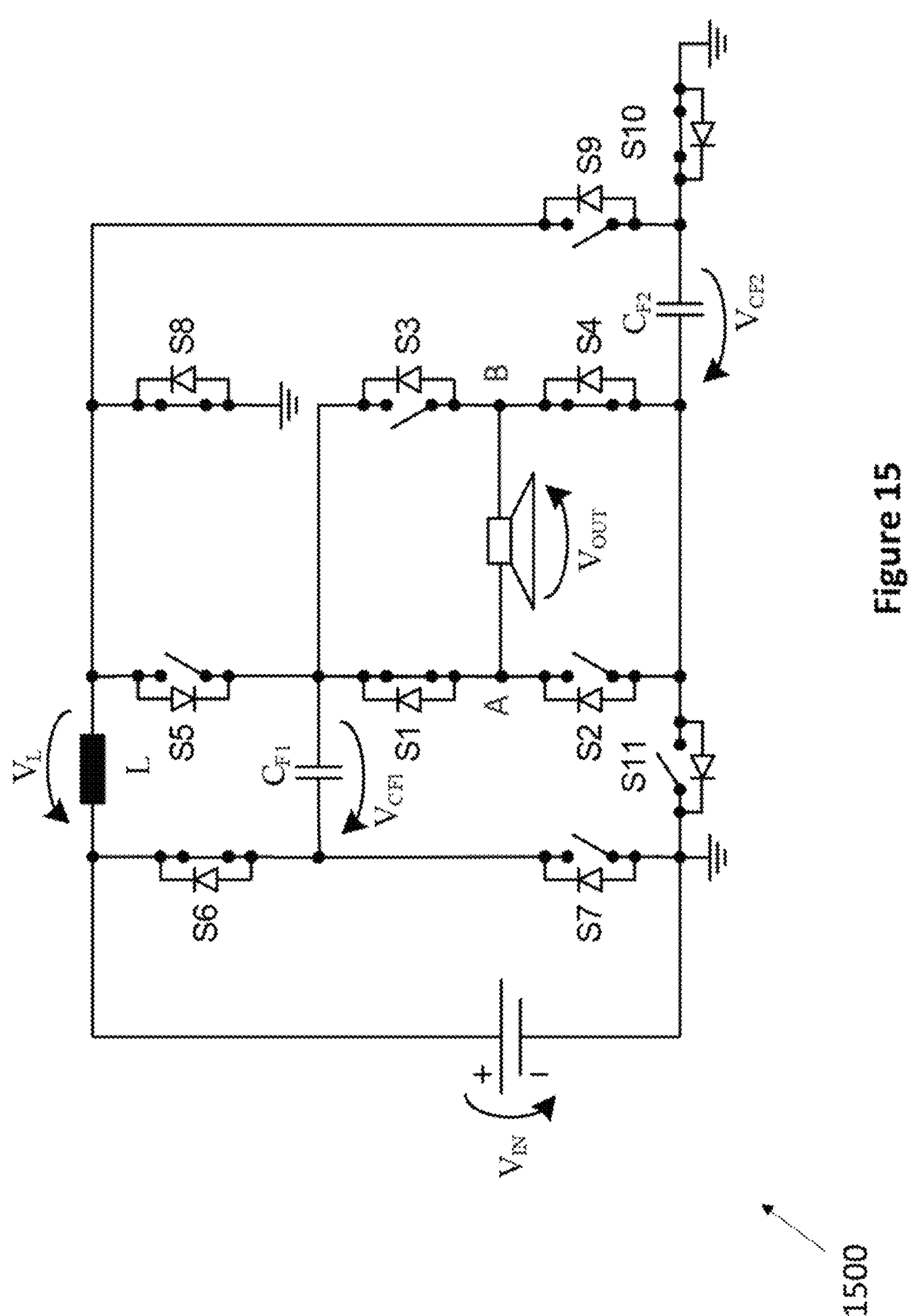
FIG. 15 is a diagram of another signal amplifier for implementing a 7-Level Class D Amplifier.

FIG. 15 shows a diagram of another signal amplifier according to the disclosure for implementing a 7-Level Class D Amplifier. The topology 1500 applies a boosted supply voltage on both the positive terminal and the negative terminal of the H-bridge. This can be used when the loudspeaker has a high resistance and requires for a same output power an increased supply voltage step-up ratio.

The circuit 1500 has 11 switches, two flying capacitors and one inductor. In FIG. 15, the switches represent operation in a state similar to MP3. A voltage $(V_{CF1}+V_{IN})$ is applied at node A, and a voltage $-V_{CF2}$ is applied at node B, so that the voltage across the load is $V_{IN}+V_{CF1}+V_{CF2}$.

Therefore, four switches are connected in series but permits the addition of two increased output pulse levels (from 5 levels to 7 levels) when driving the load with the summed voltage across the flying capacitors $V_{CF1}$ and $V_{CF2}$ and the input voltage $V_{IN}$. The 7-Level Class D Amplifier maintains a low EMI noise even for the increased maximum output amplitude.

Figure 16:
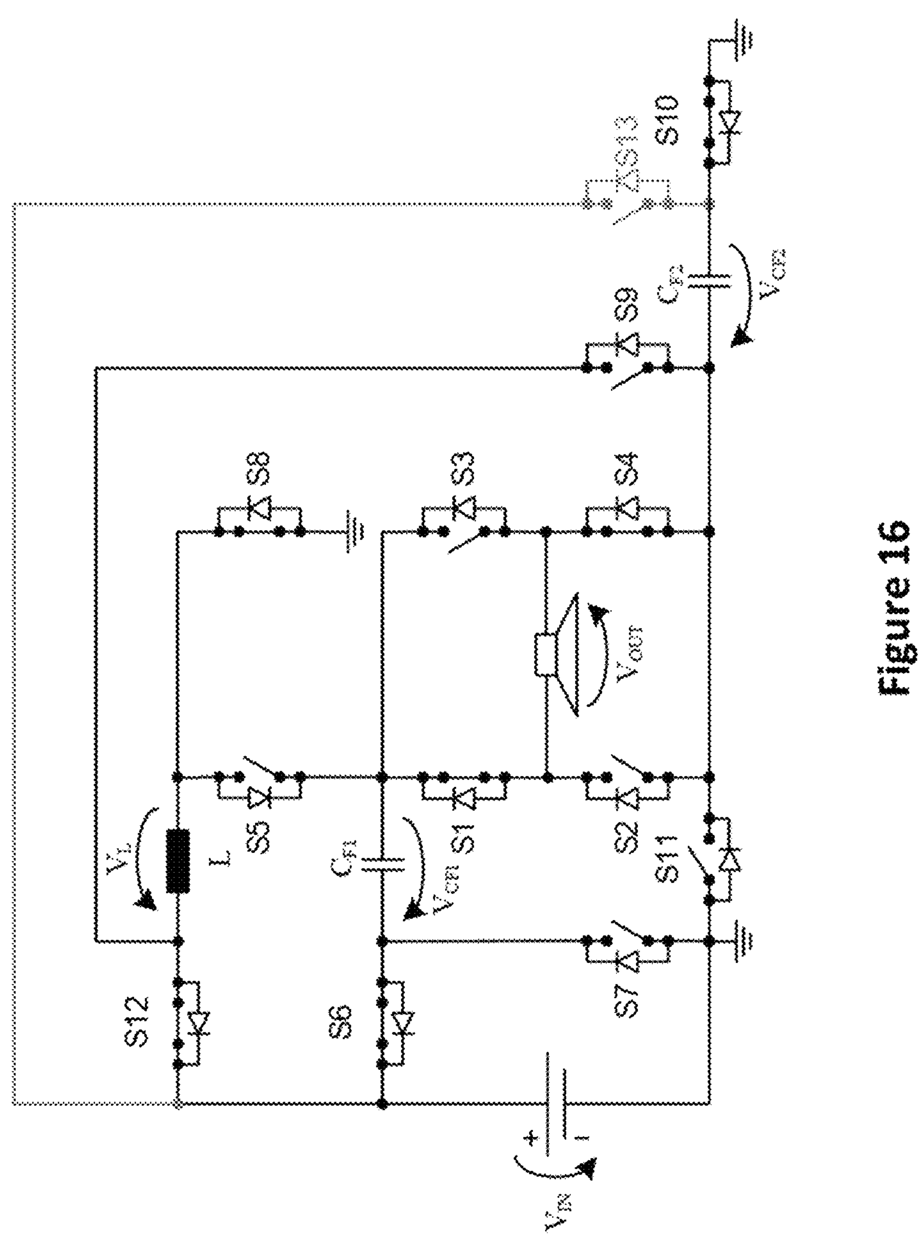
FIG. 16 is a modified version of the signal amplifier of FIG. 15.

FIG. 16 shows a modified version of the signal amplifier of FIG. 15. The circuit 1600 includes a hybrid inverting buck-boost topology (with the optional switch S13). In this implementation the maximum amplifier output amplitude may be further increased.

Figure 17:
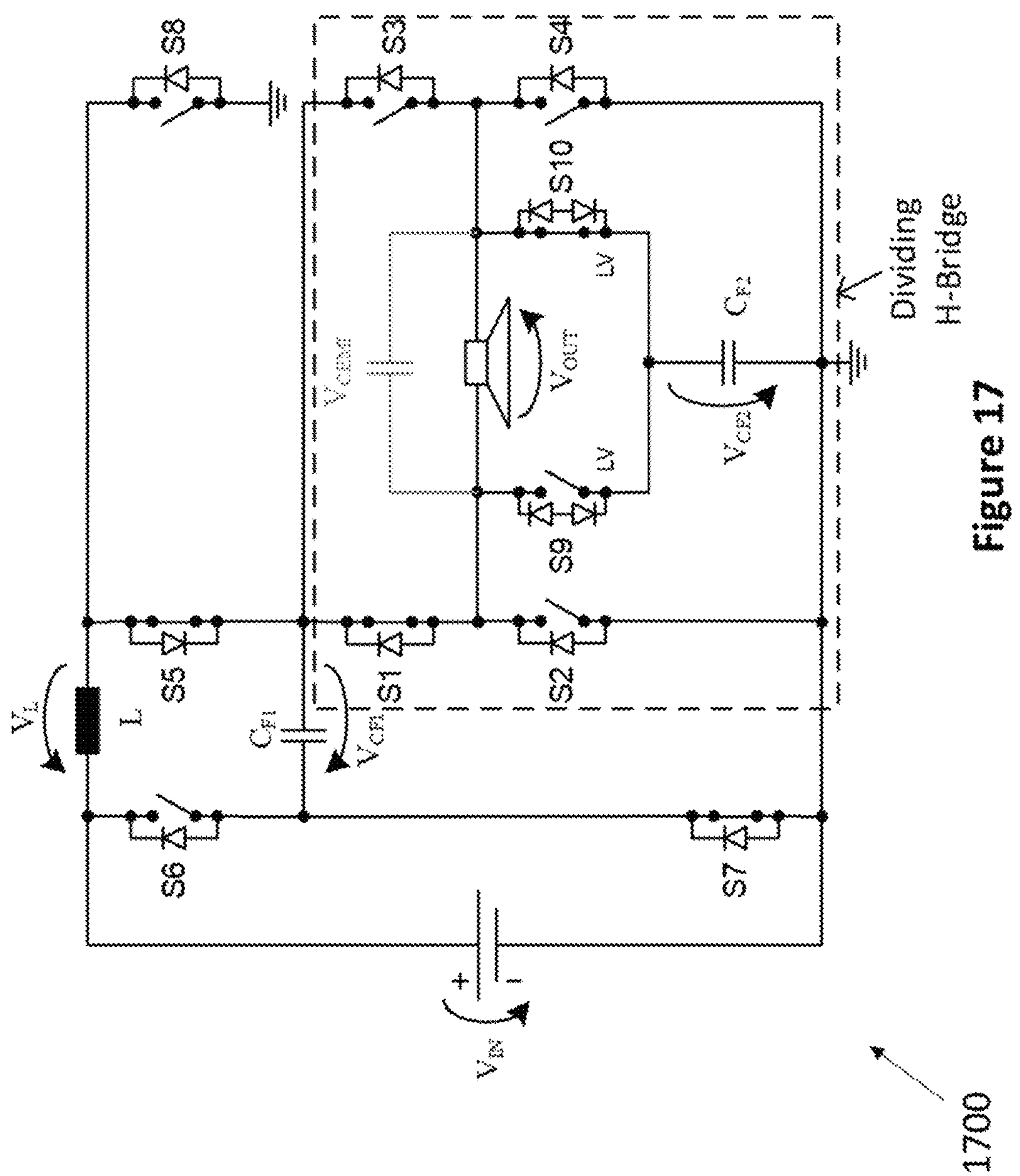
FIG. 17 is a diagram of another signal amplifier for use with relatively small output voltages.

FIG. 17 shows a diagram of another signal amplifier for use with relatively small output voltages.

Amplifier efficiency is often specified at high power levels; however maximum output levels are hardly ever met in typical audio applications. By improving the efficiency in low output conditions, the battery life can be extended to a greater extent. Two-level Class D amplifiers have a low efficiency near the average output voltage of 0. This is because to generate a 0 voltage output a 50% positive PWM and a 50% negative PWM must be generated.

The circuit 1700 has 10 switches, two flying capacitors and one inductor. In this embodiment the loudspeaker load may either directly be driven with the output levels of the step-up converter or alternatively from a reduced level generated with a 2:1 divider using the flying capacitor $C_{F2}$. In comparison to the topologies of FIGS. 4 and 14, the derivative topology 1700 enables additional pulse levels of half the supply voltage, improving amplifier efficiency especially for the low average levels of typical audio signals.

This topology still connects only three switches in series (in the state shown in FIG. 17 S5, S1, S10) but requires a back-to-back isolation for the switches S9 and S10. Their bottom isolation only must withstand the maximum voltage across the flying capacitor $C_{F2}$, which may be controlled to $V_{CF2}<V_{IN}/2$. Consequently, the switches S9 and S10 will only conduct during small amplifier output current. This enables the use of smaller FETs with reduced switching loss. The conduction loss of the anti-serial FET arrangement is also low.

In an additional capacitor divider mode, the closure of the switch S2 is replaced with the closure of S9 (closure of S4 is replaced with the closure of S10). In an alternative capacitor divider mode, the switch S9 is closed instead of S1 and connected in series with S4 (or S10 is closed instead of S3 and connected in series with S2). By controlling the relative duty cycle of these capacitor divider modes, the voltage across the flying capacitor $C_F$ can be regulated to 50% of the input voltage $V_{IN}$. The duty cycle of these modes may also be used to change the voltage across the flying capacitor $C_F$ between 100% and 50% of the input voltage $V_{IN}$ at the entry and exit of the capacitor divider mode. With some small (EMI) capacitance being connected to the terminals of the load (either differential or towards GND) the voltage across the flying capacitor may also automatically converge to 50%. During the capacitive divider modes, the PWM pulse amplitude across the speaker becomes $+-V_{IN}/2$. This enables the additional mode shown in FIG. 18.

Figure 18:
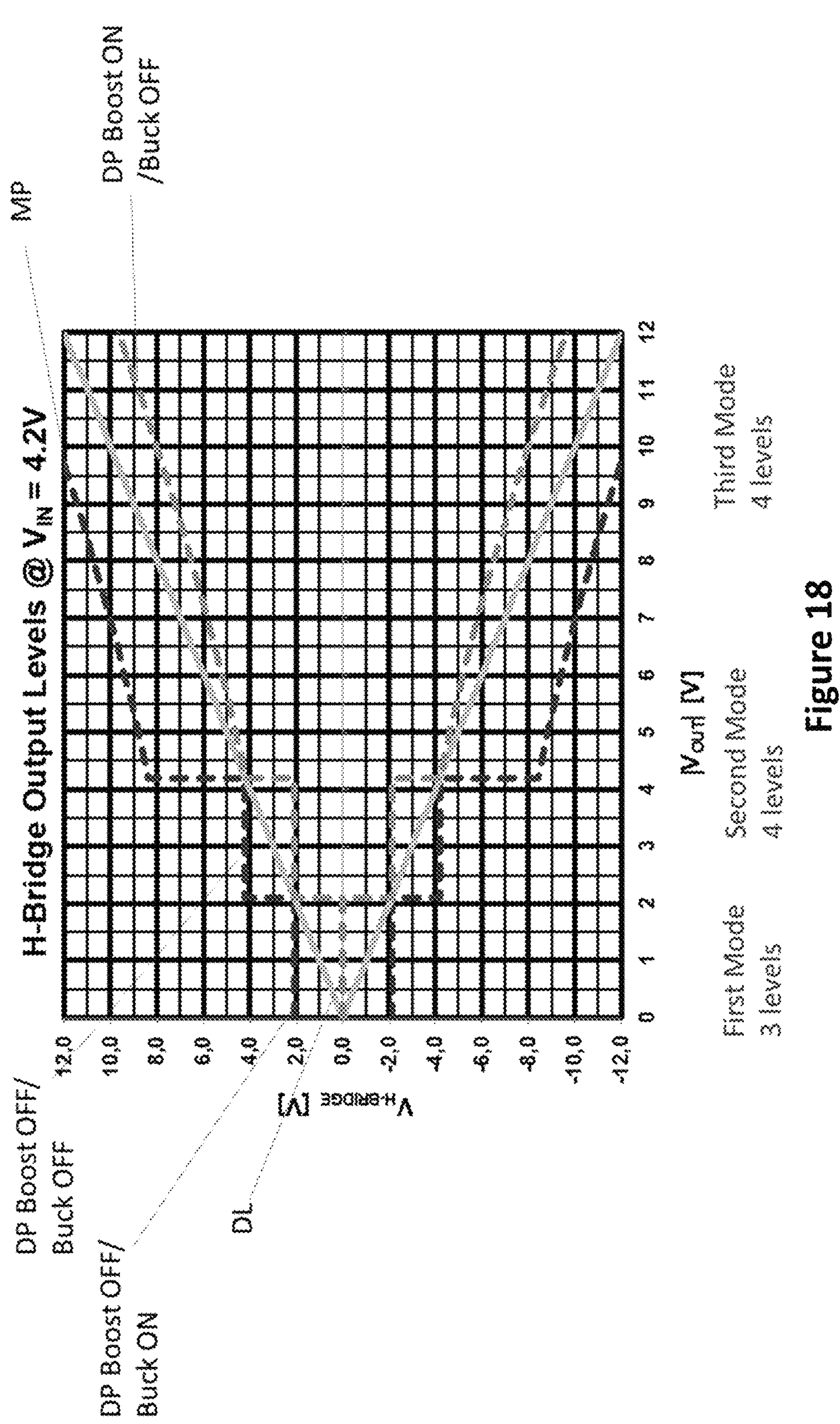
FIG. 18 is a plot showing the operation of the circuit of FIG. 17 in three different modes.

FIG. 18 is a plot showing the operation of the H-bridge circuit of FIG. 17 in three different modes. The simulation is provided for an input voltage $V_{IN}=4.2V$.

Figure 19:
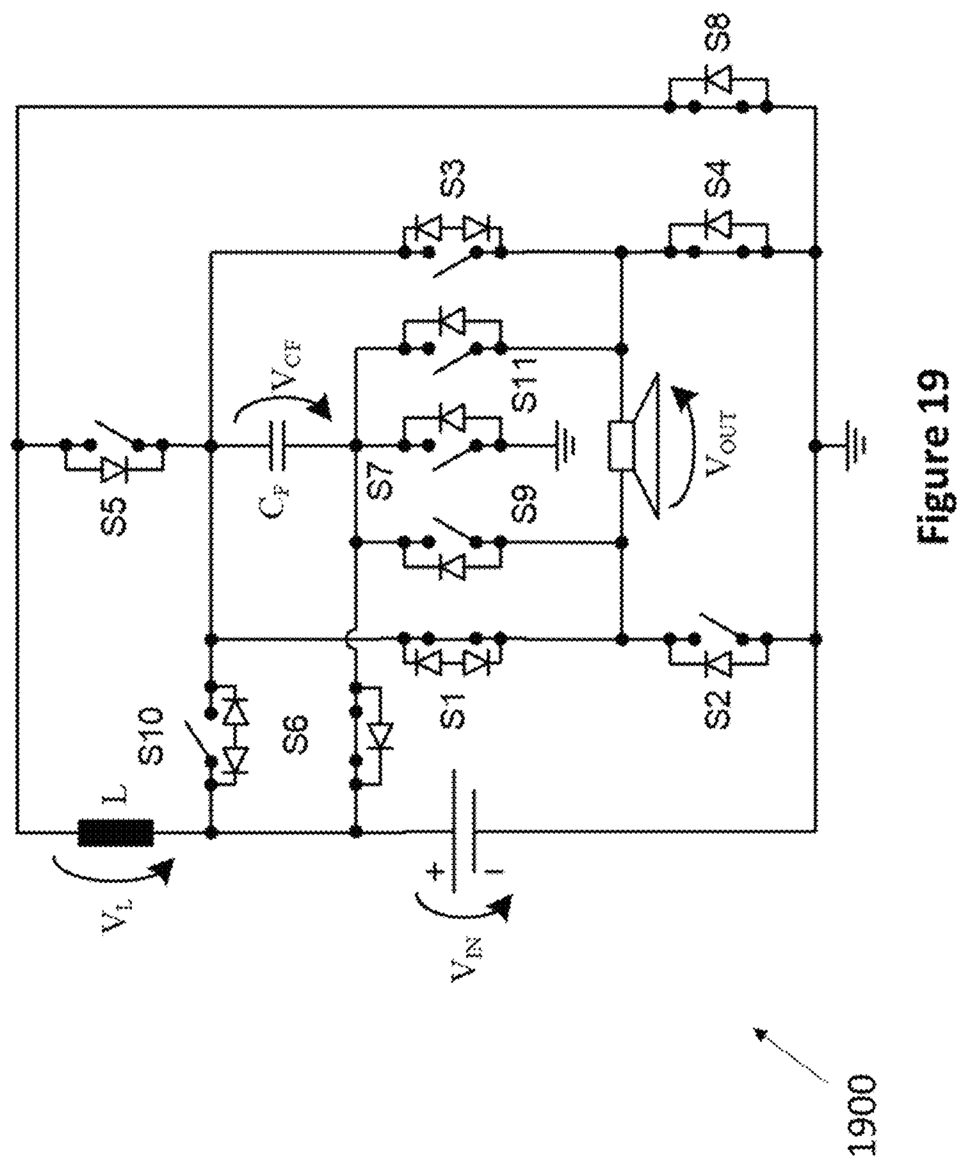
FIG. 19 is a diagram of another signal amplifier for use with relatively small output voltages.

FIG. 19 shows a diagram of another signal amplifier for use with relatively small output voltages. The topology 1900 uses 11 switches, an inductor, and a single flying capacitor.

In an additional capacitor divider mode, S10 is connected in series with S9 and S4 (or S11 and S2). In an alternative capacitor divider mode, the switch S11 is closed instead of S10 and connected in series with S1 and S4 (or S3 and S2). By controlling the relative duty cycle of the capacitive divider modes, the voltage across the flying capacitor $C_F$ can be regulated to 50% of the input voltage $V_{IN}$. The duty cycle of the capacitive divider modes may also be used to change the voltage across the flying capacitor $C_F$ between 100% and 50% of the input voltage $V_{IN}$ at the entry and exit of the capacitor divider mode. Assuming that S10 is composed of two anti-serial FETs, then four FETS are connected in series. In standard Class D operation, the switch S10 is replaced with the switch S6 hence reducing the total number of serially connected switches to three. In boost mode the switch S9 is replaced with switch S1 (or S11 is replaced with S3). In case S1 and S3 are also anti-serial connected FETs, then the total number of serially connected switches is four.

Figure 20:
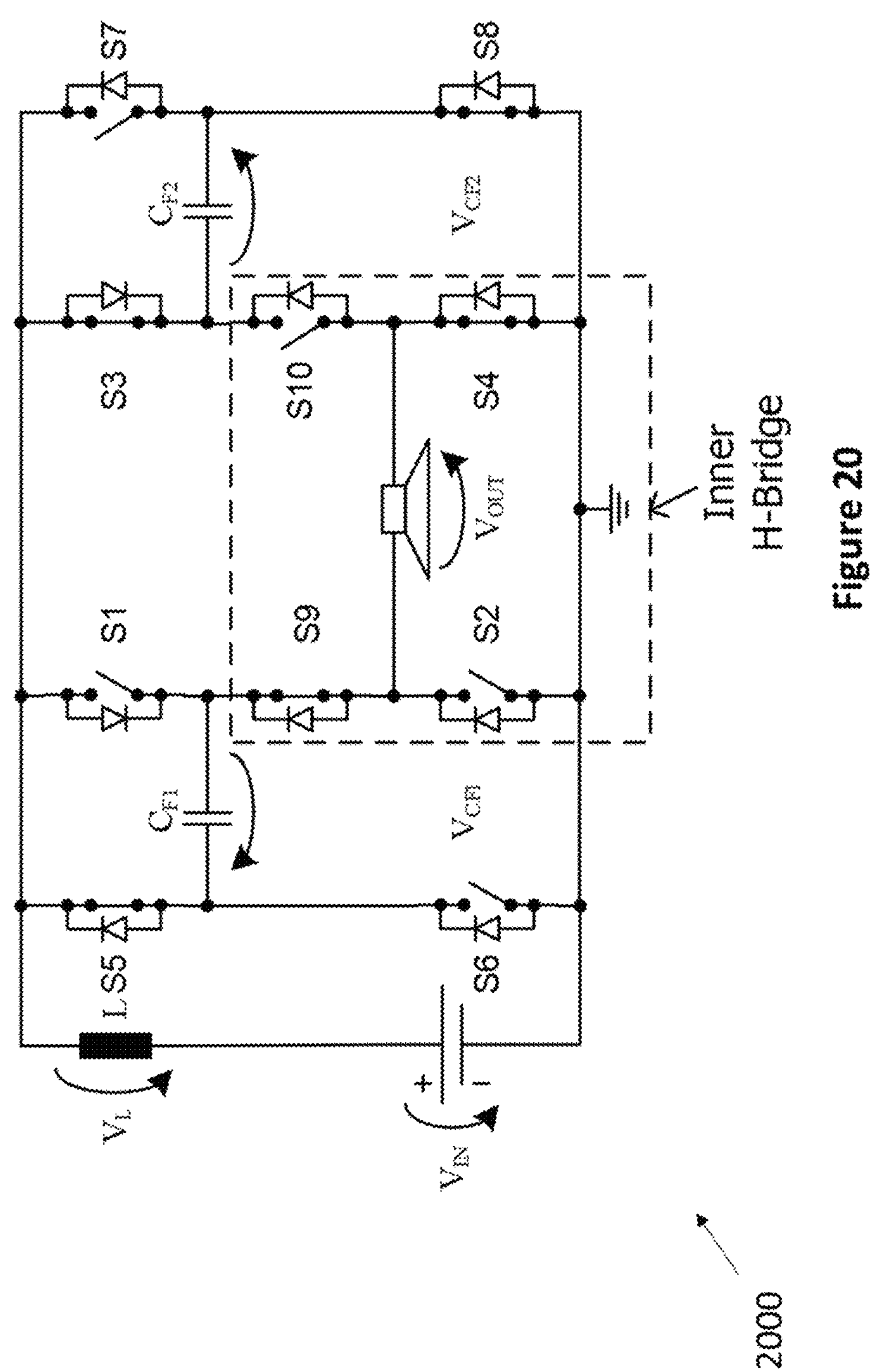
FIG. 20 is a diagram of yet another signal amplifier.

FIG. 20 shows a diagram of another signal amplifier according to the disclosure. The topology 2000 has 10 switches, one inductor and two flying capacitor providing a modified hybrid step-up converter. This circuit does not require back-to back isolation and only connects three switches in series in between the power supply and the loudspeaker load.

The standard Class D operation may be implemented with the modified positive and negative states DP and DN, in combination with a modified neutral state DL.

FIG. 21A shows the signal amplifier of FIG. 20 operating in a positive state DP. FIG. 21B shows the signal amplifier of FIG. 20 operating in a negative state DN. When combined with the magnetization states MP and MN the states DP and DN become de-magnetization states. FIG. 21C shows the signal amplifier of FIG. 20 operating in a neutral state DL. The flying capacitors $C_{F1}$ and $C_{F2}$ implement in combination with the inductor L a filter for the current ripple created by the switching operation of the inner H-bridge. The sequence for boosted class D operation may include the inductor magnetization state MP.

FIG. 21D shows the signal amplifier of FIG. 20 operating in the HIGH positive state MP (magnetisation state for high positive output voltage). FIG. 21E shows the signal amplifier of FIG. 20 operating in the HIGH negative state MN (magnetization state for high negative output voltage). The switching sequence requires in addition to the demagnetization state DP of FIG. 21A a second demagnetization state BP to implement the HIGH output pulse and to enable a volt-sec balance across the inductor L in combination with a charge balance for the flying capacitors $C_{F1}$ and $C_{F2}$. FIG. 21F shows the signal amplifier of FIG. 20 operating in the demagnetization positive state BP for positive output voltage. FIG. 21G shows the signal amplifier of FIG. 20 operating in the demagnetization negative state BN for negative output voltage.

For this topology, the relative duration of switching state BP in comparison to the summed duration of switching states DP and MP regulates the averaged H-bridge output level in between the HIGH pulse level $V_{BP}=V_{CF1}+V_{CF2}$ and the LOW pulse level $V_{DP}=V_{MP}=V_{CF1}=V_{CF2}$. The voltage $V_{CF1}=V_{CF2}$ across the flying capacitors $C_{F1}$ and $C_{F2}$ is controlled by the relative duration of switching state MP in comparison to the summed duration of switching states DP and BP. As a result, the peak-to-peak voltage ripple of adjacent pulses, as well as the complexity of the control during boosted Class D operation is increased. However, the duty cycle of the H-bridge may be decoupled from the supply voltage step-up ratio to improve efficiency via increased accuracy of the Class H signal tracking.

In this topology there is no current path from the input that is bypassing the inductor (see e.g., switch S6 in previous topologies). Consequently, the inductor filters noise emission from the switching H-bridge.

The topology from FIG. 20 is limited by a delayed converter response to transients. The output pulse level during the magnetization states MP and MN is not HIGH. This introduces a Right-Half-Plane-Zero into the control loop of the boost converter, triggering a delayed response and causing the typical boost converter voltage drop during a transient load step (risk for H-bridge saturation during a fast rise of the amplifier output amplitude).

Figure 22:
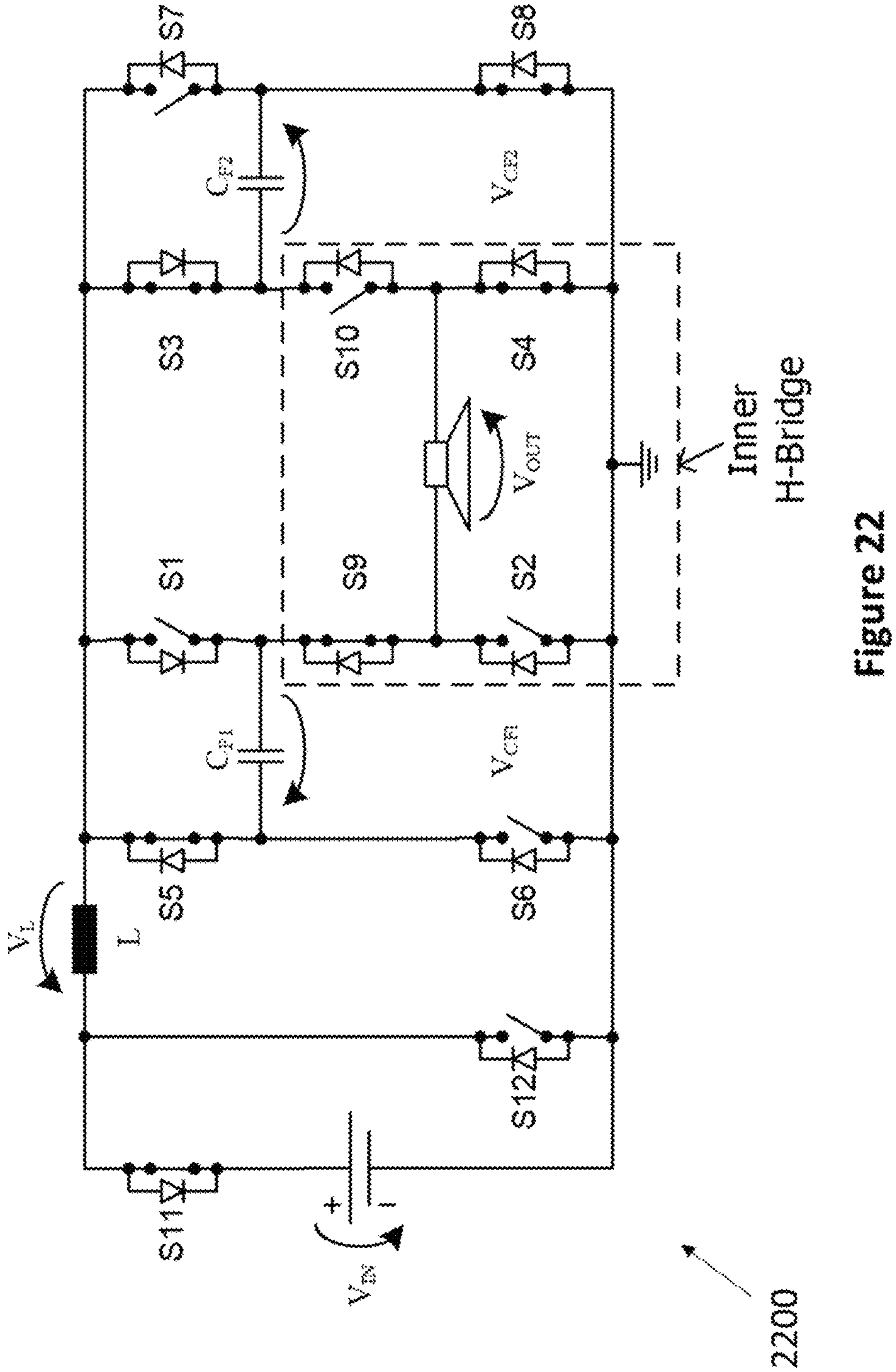
FIG. 22 is a diagram of yet another signal amplifier.

FIG. 22 is a diagram of another signal amplifier according to the disclosure. The circuit 2200 includes 12 switches, two flying capacitors and one inductor. With the two additional switches S11 and S12, the number of serially connected switches increases to four, however the voltages $V_{CF1}$ and $V_{CF2}$ across the flying capacitors $C_{F1}$ and $C_{F2}$ may also be reduced, effectively extending the range of possible signal tracking to levels below the supply voltage $V_{IN}$. Like the embodiment of FIG. 17, the topology 2200 improves the amplifier efficiency especially for low average levels of typical audio signals.

Figure 23:
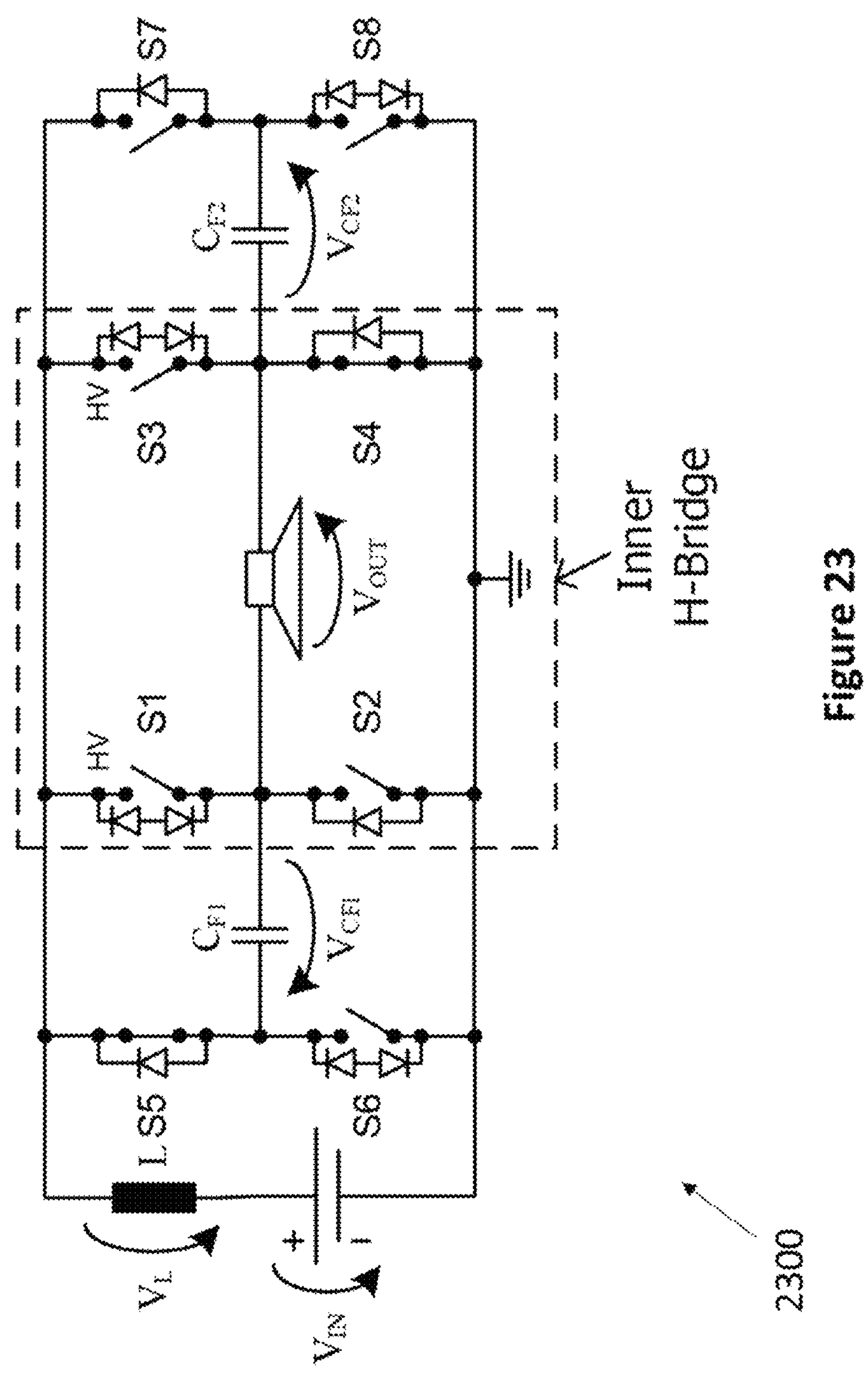
FIG. 23 is a diagram of yet another signal amplifier.

FIG. 23 is a diagram of another signal amplifier according to the disclosure. The circuit 2300 has eight switches, two flying capacitors and one inductor. This topology reduces the number of switches connected in series in between the power supply and the loudspeaker load to two but re-introduces the need for multiple back-to-back switches.

Figure 24:
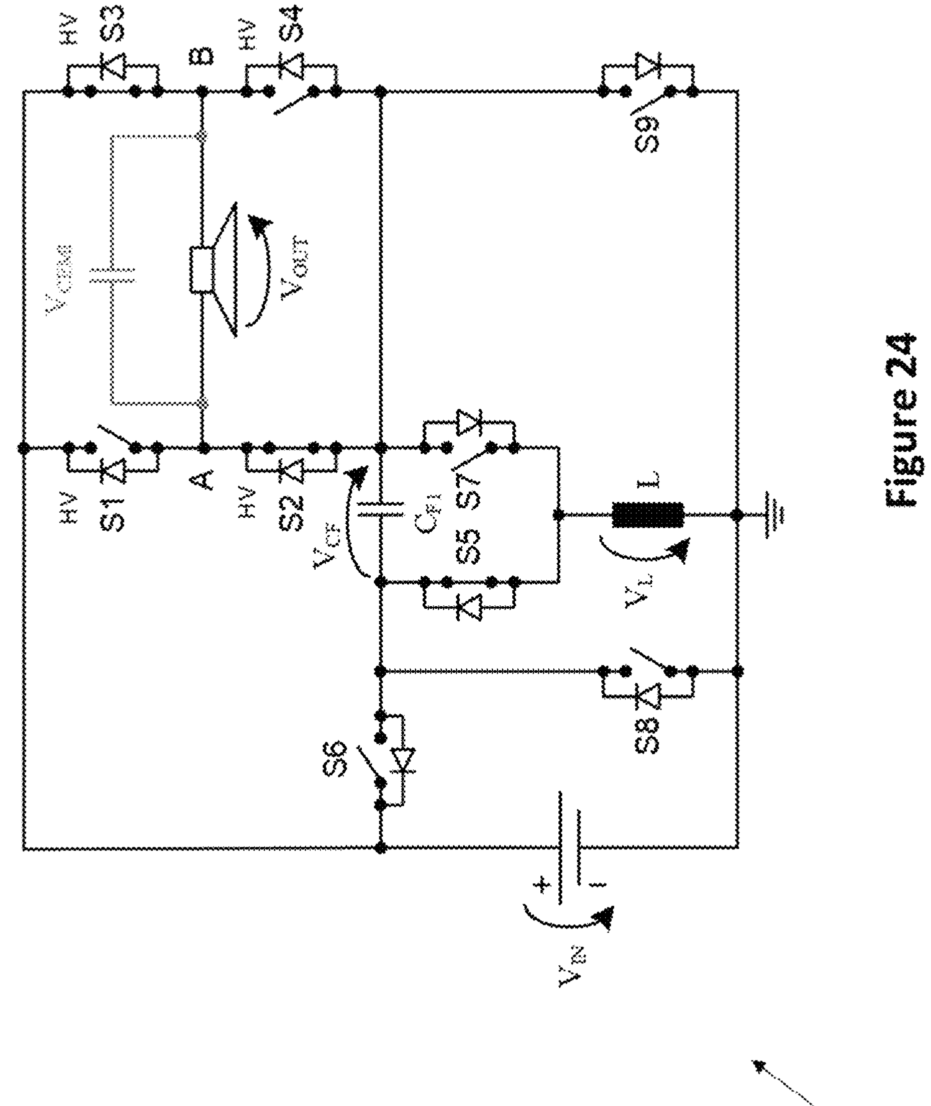
FIG. 24 is a diagram of a class H amplifier according to the disclosure.

FIG. 24 is a diagram of another signal amplifier according to the disclosure. The circuit 2400 is a class H amplifier based on a hybrid inverting buck-boost converter connected to the bottom supply rail of the H-bridge. This topology has nine switches, a flying capacitor and one inductor and implements five different pulse levels. In this case however only two levels are dynamically changing the amplitude of the signal. In FIG. 24 the switches are in a HIGH state (MN). A voltage $V_{IN}$ is provided at node B via S3, and a voltage $V_L-V_{CF}$ is applied to node A via L, S5, CF and S2. So, the voltage $V_{OUT}=V_{IN}-V_L+V_{CF}$. Traditional class D operation with DP, DN and DL states is implemented in case the bottom supply rail of the H-bridge is with a closed switch S9 instead connected to the ground terminal.

Figure 25:
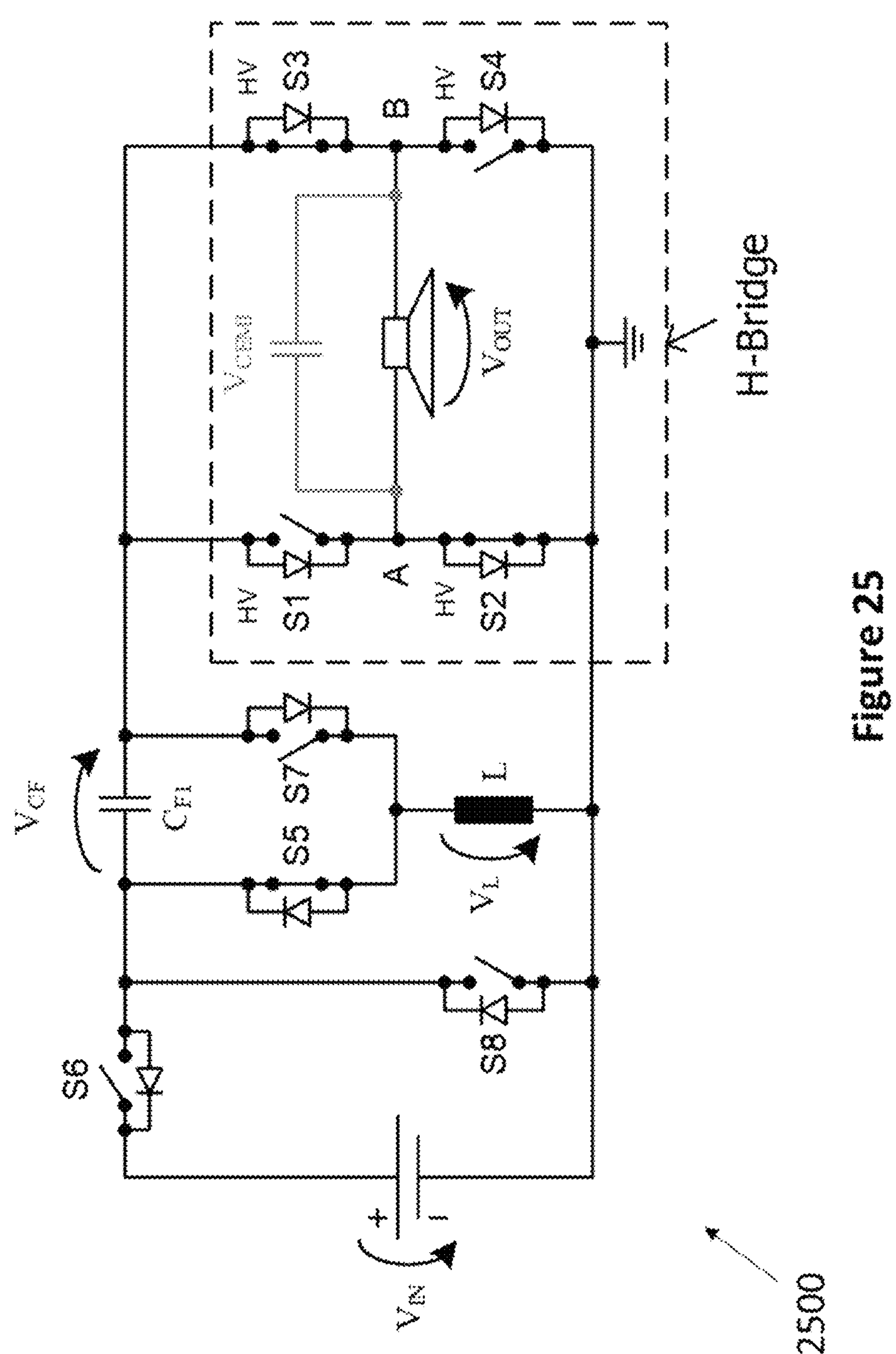
FIG. 25 is a diagram of yet another signal amplifier.

FIG. 25 is a diagram of another signal amplifier according to the disclosure.

The circuit 2500 has eight switches, one flying capacitor and one inductor. This topology provides a 3-Level Class H derivative from FIG. 24 which improves amplifier efficiency especially for the dominant (low) average levels of typical audio signals. This topology is potentially limited by a steep increasing average inductor current during peaks of the output amplitude in combination with an audio delay in the range as typically required for traditional Class H amplifiers.

The topologies described above with references to FIGS. 4 to 25 present several advantages over the prior art. Via a parallel generation of multiple supply voltage levels, selected instantaneously at the input of the H-bridge, the hybrid Class D Amplifier of the disclosure outperforms in efficiency and audio delay prior art solutions that simply cascade an inductive boost converter with a H-bridge (see for example prior art of Chen, "Embedded Single-Inductor Bipolar-Output DC-DC Converter in Class-D Amplifier for Low Common Noise", IEEE, 2016). Multiple pulse levels may dynamically adopt their level, implementing especially for peaks of typical audio signals a Class H operation with superior efficiency compared to traditional Multi-Level Amplifiers using fixed supply voltage steps (Class G). Circuit switches responsible for the step-up conversion automatically stop toggling when providing only low or mid amplifier output power, effectively removing corresponding switching loss.

As the supply voltage step-up conversion is integrated into the control of the H-bridge average output voltage, there is no overhead for a separate boost converter control loop. The peak-to-peak voltage ripple of adjacent pulses is (especially during the provision of high output power) maintained below the level of the input voltage $V_{IN}$, minimizing input current ripple and removing the need for bulky EMI L-C output filters. The total number of switches as well as the number of serially connected switches in between the power supply and the load (loudspeaker) may be reduced against prior art Multi-Level Class D Amplifiers (MLCD) of comparable maximum output amplitude. This reduces switching loss as well as conduction loss, improving the efficiency of the boosted Multi-Level Class D Amplifier.

The embedded hybrid step-up converter reduces the inductor current ripple in comparison to a pure inductive boost converter, enabling the use of smaller inductors with reduced inductance and/or saturation current ratings. The topologies of FIGS. 14 and 23 implement the lowest possible number of serially connected switches within a H-bridge and therefore minimize power loss inside the switching circuit. They should be considered in case the maximum amplifier output voltage enables the use of MOS-FETs implementing dynamic back-biasing (configurable direction of the parasitic body diode). The topologies of FIGS. 4, 17 and 19 may provide a better combination of serially connected FETs and required voltage rating. It should be noted that the voltage step-up conversion of the topologies of FIGS. 4 and 17 support inductor magnetization in parallel to the provision of a high level output pulse, removing the typical transient load step output voltage drop of inductive boost converters, which suffer from a Right-Half-Plane-Zero (RHPZ) regulation bandwidth limitation. The embodiments of FIGS. 17, 22 and 25 further improve battery life at the dominant (low) average levels of real-world audio signals via a reduced ripple of the H-bridge.

The topologies presented, as well as the corresponding switching sequences are example embodiments of the signal amplifier of the disclosure which may be modified or combined in different ways. For instance, the standard H-bridge may be replaced with the dividing H-bridge from FIG. 17. Various modifications may be considered, for instance the full bridge circuit may be replaced with a Half-bridge, adding switches, inductors, and capacitors, or implementing the capacitive divider at the positive terminal of the H-bridge etc. . . . The signal amplifier of the disclosure is also not limited to audio amplifiers and may for example also be used for motor drivers, the supply of boosted (envelope tracking) RF amplifiers and other applications implementing a pulsed output signal.

A skilled person will therefore appreciate that variations of the disclosed arrangements are possible without departing from the disclosure. Accordingly, the above description of the specific embodiments is made by way of example only and not for the purposes of limitation. It will be clear to the skilled person that minor modifications may be made without significant changes to the operation described.

The invention claimed is:

1. A signal amplifier comprising:

a network of switches provided between an input port an output port and a ground port, the network of switches being arranged to form a power converter coupled to a H-bridge circuit, wherein the power converter comprises a flying capacitor and an inductor; the power converter being adapted to receive an input voltage from an input voltage supply and to provide a converted voltage, and the H-bridge circuit being adapted to receive the converted voltage and to apply an output modulated voltage to a load; and a driver adapted to operate the H-bridge circuit in a plurality of states for providing the output modulated voltage, the driver being adapted to drive the network of switches in a neutral state, a first state and a second state;

wherein in the neutral state no voltage is applied to the load;

wherein in the first state, the input voltage supply and the inductor are serially coupled and wherein the flying capacitor is coupled in parallel with the serially coupled input voltage supply and inductor; and wherein in the second state, the flying capacitor is coupled in series with at least one of the input voltage supply and the inductor.

2. The signal amplifier as claimed in claim 1, wherein the signal amplifier has two modes of operation: a first mode during which the driver drives the network of switches between the neutral state and the first state, and a second mode during which the driver drives the network of switches between the first state and the second state.

3. The signal amplifier as claimed in claim 1, wherein in the first state, the ground port is coupled to the ground port via a path that includes the flying capacitor through the load.

4. The signal amplifier as claimed in claim 1, wherein in the second state, the input port is coupled to the ground port via a first path comprising the flying capacitor and the load.

5. The signal amplifier as claimed in claim 4, wherein in the second state, the input port is coupled to the ground port via two paths, the first path and a second path comprising the inductor.

6. The signal amplifier as claimed in claim 1, wherein the second state is a magnetization state to magnetize the inductor.

7. The signal amplifier as claimed in claim 1, wherein the first state is a positive state for providing a positive output voltage or a negative state for providing a negative output voltage.

8. The signal amplifier as claimed in claim 1, wherein the second state is a positive state for providing a positive output voltage or a negative state for providing a negative output voltage.

9. The signal amplifier as claimed in claim 1, wherein the power converter is a step up power converter, or wherein the power converter is a step-down converter.

10. The signal amplifier as claimed in claim 1, wherein the power converter is an inverting power converter.

11. The signal amplifier as claimed in claim 1, wherein the signal amplifier is a multi level class D amplifier.

12. The signal amplifier as claimed in claim 1, wherein the H-bridge circuit comprises a pair of output terminals for providing the output modulated voltage to the load.

13. The signal amplifier as claimed in claim 1, wherein the power converter comprises a first flying capacitor and a second flying capacitor.

14. The signal amplifier as claimed in claim 13, wherein in the first state, the input voltage supply and the inductor are serially coupled and wherein each one of the first flying capacitor and the second flying capacitor are coupled in parallel with the serially coupled input voltage supply and inductor; and wherein in the second state, the first flying capacitor is coupled in series with the inductor and the input voltage supply.

15. The signal amplifier as claimed in claim 14, wherein the driver is adapted to drive the network of switches in a third state, wherein in the third state the first flying capacitor is coupled in series with the inductor and the input voltage supply, and wherein the second flying capacitor is coupled in parallel with the serially coupled input voltage supply and inductor.

16. The signal amplifier as claimed in claim 1, wherein the inductor has a first terminal coupled to the voltage supply, and a second terminal coupled to the ground port via a single switch.

17. The signal amplifier as claimed in claim 1, wherein the inductor has a first terminal coupled to the voltage supply, and a second terminal coupled to the ground port via two switches.

18. The signal amplifier as claimed in claim 1, wherein the inductor has a first terminal coupled to the flying capacitor, and a second terminal connected to the ground port.

19. The signal amplifier as claimed in claim 1, wherein the H-bridge circuit is a full bridge circuit or a half bridge circuit.

20. The signal amplifier as claimed in claim 1, wherein the inductor has a first inductor terminal coupled to the input port and a second inductor terminal, and wherein the network of switches comprises:

an input switch for coupling the flying capacitor to the input port;

a first ground switch for coupling the flying capacitor to the ground port;

an inductor switch for coupling the flying capacitor to the second inductor terminal; and a second ground switch for coupling the inductor to the ground port.

21. The signal amplifier as claimed in claim 13, wherein the inductor has a first inductor terminal coupled to the input port and a second inductor terminal, and wherein the network of switches comprises:

a first inductor switch for coupling the first flying capacitor to the second inductor terminal;

a first ground switch for coupling the first flying capacitor to the ground port;

a second inductor switch for coupling the second flying capacitor to the second inductor terminal; and a second ground switch for coupling the second flying capacitor to the ground port.

22. The signal amplifier as claimed in claim 1, wherein the inductor has a first inductor terminal coupled to the ground port and a second inductor terminal, and wherein the network of switches comprises:

an input switch for coupling a first terminal of the flying capacitor to the input port;

a first ground switch for coupling the first terminal of the flying capacitor to the ground port;

a first inductor switch for coupling the first terminal of the flying capacitor to the second inductor terminal; and a second inductor switch for coupling a second terminal of the flying capacitor to the second inductor terminal.

23. A method of amplifying an input signal, the method comprising:

providing a network of switches between an input port, an output port and a ground port, the network of switches being arranged to form a power converter coupled to a H-bridge circuit, wherein the power converter comprises a flying capacitor and an inductor; the power converter being adapted to receive an input voltage from an input voltage supply and to provide a converted voltage, and the H-bridge circuit being adapted to receive the converted voltage and to apply an output modulated voltage to a load;

providing a driver to operate the H-bridge circuit in a plurality of states for providing the output modulated voltage, the driver being adapted to drive the network of switches in a neutral state, a first state and a second state;

wherein in the neutral state no voltage is applied to the load;

wherein in the first state, the input voltage supply and the inductor are serially coupled and wherein the flying capacitor is coupled in parallel with the serially coupled input voltage supply and inductor; and wherein in the second state, the flying capacitor is coupled in series with at least one of the input voltage supply and the inductor.

* * * * *